US011310447B2

(12) United States Patent
Yun et al.

(10) Patent No.: US 11,310,447 B2
(45) Date of Patent: Apr. 19, 2022

(54) IMAGE SENSOR CONTROLLING A CONVERSION GAIN, IMAGING DEVICE HAVING THE SAME, AND METHOD OF OPERATING THE SAME

(71) Applicant: SAMSUNG ELECTRONICS CO., LTD., Suwon-si (KR)

(72) Inventors: Jungbin Yun, Hwaseong-si (KR); Hwanwoong Kim, Namyangju-si (KR); Eunsub Shim, Hwaseong-si (KR); Kyungho Lee, Suwon-si (KR); Hongsuk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/997,234

(22) Filed: Aug. 19, 2020

(65) Prior Publication Data
US 2021/0144315 A1 May 13, 2021

(30) Foreign Application Priority Data
Nov. 12, 2019 (KR) .......................... 10-2019-0144199

(51) Int. Cl.
| | |
|---|---|
| *H04N 5/343* | (2011.01) |
| *H04N 5/369* | (2011.01) |
| *H04N 5/374* | (2011.01) |
| *H04N 5/355* | (2011.01) |
| *H01L 27/146* | (2006.01) |

(52) U.S. Cl.
CPC ........... *H04N 5/3559* (2013.01); *H04N 5/343* (2013.01); *H04N 5/3698* (2013.01); *H04N 5/374* (2013.01); *H01L 27/14603* (2013.01); *H01L 27/14621* (2013.01); *H01L 27/14645* (2013.01)

(58) Field of Classification Search
None
See application file for complete search history.

(56) References Cited

U.S. PATENT DOCUMENTS

| | | | |
|---|---|---|---|
| 9,245,917 B2 | 1/2016 | Fan | |
| 9,247,170 B2 | 1/2016 | Komori et al. | |
| 9,277,147 B2 | 3/2016 | Beck | |
| 10,432,879 B2 | 10/2019 | Chang et al. | |
| 2004/0251394 A1 | 12/2004 | Rhodes et al. | |
| 2007/0035649 A1 | 2/2007 | McKee | |
| 2009/0237540 A1 | 9/2009 | Johnson | |
| 2015/0146060 A1* | 5/2015 | Suzuki | H04N 5/363 348/300 |

(Continued)

*Primary Examiner* — Quan Pham
(74) *Attorney, Agent, or Firm* — Sughrue Mion, PLLC

(57) ABSTRACT

Provided is an image sensor including a first pixel including a first floating diffusion region and a second floating diffusion region, a second pixel including a first floating diffusion region, a second floating diffusion region, and a third floating diffusion region, a third pixel including a first floating diffusion region and a second floating diffusion region, and a fourth pixel including a first floating diffusion region, a second floating diffusion region, and a third floating diffusion region, wherein the second floating diffusion region of the first pixel and the second floating diffusion region of the second pixel are connected through a first metal line, and wherein the third floating diffusion region of the second pixel and the third floating diffusion region of the third pixel are connected through a second metal.

18 Claims, 25 Drawing Sheets

(56) References Cited

U.S. PATENT DOCUMENTS

| | | | | |
|---|---|---|---|---|
| 2015/0303234 A1* | 10/2015 | Mabuchi | ............... | H04N 5/363 |
| | | | | 257/229 |
| 2015/0350574 A1* | 12/2015 | Okado | ................... | H04N 5/378 |
| | | | | 348/308 |
| 2018/0054576 A1* | 2/2018 | Otaka | .................... | H04N 5/379 |
| 2019/0280031 A1 | 9/2019 | Oh | | |
| 2019/0341411 A1* | 11/2019 | Lim | ................. | H01L 27/14641 |
| 2021/0104562 A1* | 4/2021 | Nakanishi | ......... | H01L 27/14612 |

\* cited by examiner

FIG. 8D
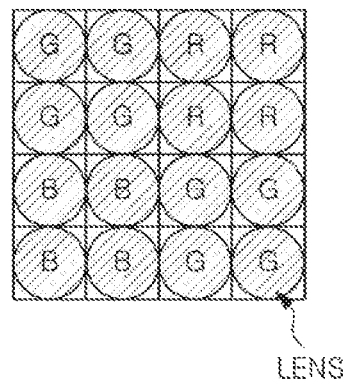
FIG. 9A
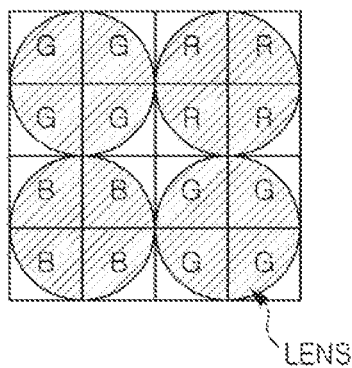
FIG. 9B

IMAGE SENSOR CONTROLLING A CONVERSION GAIN, IMAGING DEVICE HAVING THE SAME, AND METHOD OF OPERATING THE SAME

CROSS-REFERENCE TO THE RELATED APPLICATION

This application claims priority from Korean Patent Application No. 10-2019-0144199 filed on Nov. 12, 2019 in the Korean Intellectual Property Office, the entire disclosure of which is incorporated herein by reference.

BACKGROUND

1. Field

Example embodiments of the present disclosure relate to an image sensor, an imaging device including the same, and a method of operating the same.

2. Description of Related Art

In general, image sensors convert optical images into electrical signals. Recently, with the development of the computer industry and the communications industry, demand for improved image sensors in various fields is increasing. Image sensors include charge coupled devices (CCDs) and complementary metal-oxide-semiconductor (CMOS) image sensors. Among these, CMOS image sensors may be easily driven, and the signal processing circuit may be integrated on a single chip, thereby miniaturizing products. CMOS image sensors also have very low power consumption, and thus, may be used in products with limited battery capacity. In addition, CMOS image sensors may be used interchangeably with CMOS process technology, reducing manufacturing costs. Therefore, the use of CMOS image sensors is rapidly increasing as high resolution is implemented with technological development.

SUMMARY

One or more example embodiments provide an image sensor controlling a conversion gain depending on an operating mode, an imaging device including the same, and a method of operating the same.

According to an aspect of an example embodiment, there is provided an image sensor including a first pixel including a first floating diffusion region and a second floating diffusion region, a second pixel including a first floating diffusion region, a second floating diffusion region, and a third floating diffusion region, a third pixel including a first floating diffusion region and a second floating diffusion region, and a fourth pixel including a first floating diffusion region, a second floating diffusion region, and a third floating diffusion region, wherein the second floating diffusion region of the first pixel and the second floating diffusion region of the second pixel are connected through a first metal line, and wherein the third floating diffusion region of the second pixel and the third floating diffusion region of the third pixel are connected through a second metal line According to another aspect of an example embodiment, there is provided an image sensor including a first pixel, a second pixel, a third pixel, and a fourth pixel, wherein each of the first to fourth pixels includes a first transistor configured to connect at least one photodiode and a first floating diffusion node based on a transfer gate signal, a second transistor configured to connect the first floating diffusion node and a second floating diffusion node based on a first conversion gain signal, a third transistor including a drain connected to the second floating diffusion node, a fourth transistor including a source connected to a power supply terminal configured to provide a pixel driving voltage and a gate connected to the first floating diffusion node, and a fifth transistor including a source connected to a drain of the fourth transistor, a drain connected to a column line, and a gate configured to receive a selection signal, wherein the second floating diffusion node of the first pixel and the second floating diffusion node of the second pixel are connected through a metal line, wherein a second floating diffusion node of the third pixel and the second floating diffusion node of the fourth pixel are connected through a metal line, and wherein a third floating diffusion node of the second pixel and a third floating diffusion node of the third pixel are connected through a metal line.

According to another aspect of an example embodiment, there is provided a method of operating an imaging device including receiving an operating mode from an image sensor, and controlling a size of a floating diffusion region of a pixel group based on the received operating mode, wherein the operating mode comprises at least three operating modes

BRIEF DESCRIPTION OF DRAWINGS

The above and/or other aspects, features, and advantages of the example embodiments will be more clearly understood from the following detailed description, taken in conjunction with the accompanying drawings, in which:

FIG. 8A is a drawing illustrating a pixel composed of a 2×2 bayer pattern, FIG. 8B is a drawing illustrating a pixel composed of a 4×4 tetra pattern, FIG. 8C is a drawing illustrating a pixel composed of an 8×8 Q-cell pattern, and FIG. 8D is a diagram illustrating a pixel having an infrared light (IR) subpixel;

FIG. 9A illustrates a tetrapixel having a lens corresponding to each color subpixel, FIG. 9B illustrates a tetrapixel having a lens corresponding to four same color subpixels.

DETAILED DESCRIPTION

Hereinafter, example embodiments will be described in detail with reference to the accompanying drawings.

Figure 1:
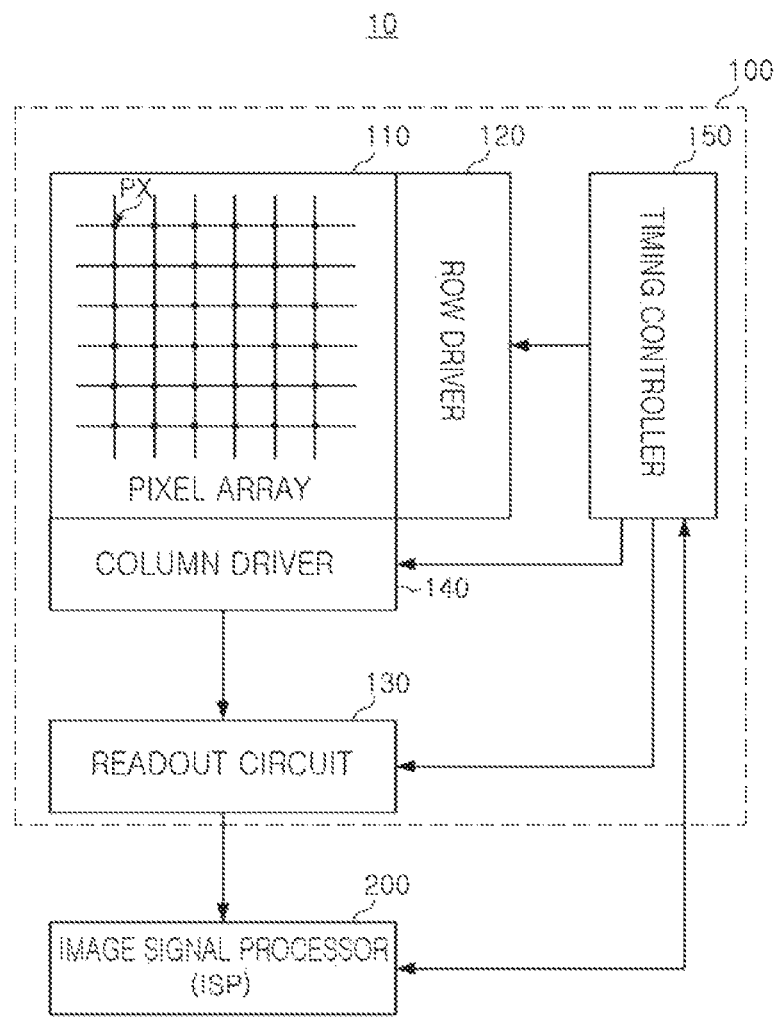
FIG. 1 is a drawing illustrating an imaging device 10 according to an example embodiment.

FIG. 1 is a drawing illustrating an imaging device 10 according to an example embodiment. Referring to FIG. 1, the imaging device 10 may include an image sensor 100 and an image signal processor (ISP) 200.

The image sensor 100 may be implemented to detect an object. The image sensor 100 may include a pixel array 110, a row driver 120, a readout circuit 130, a column driver 140, and a timing controller 150.

The pixel array 110 may include a plurality of pixels disposed in an array form of a plurality of row lines and a plurality of column lines. Each of the plurality of pixels may include a color filter to pass specific wavelengths of light. For example, the color filter may be at least one of a red filter passing the wavelengths of light in a red region among wavelengths of light in a visible region, a green filter passing wavelengths of light in a green region among the wavelengths of light in the visible region, or a blue filter passing wavelengths of light in a blue region among the wavelengths of light in the visible region. However, embodiments are not limited thereto. For example, the color filter may be at least one of a cyan filter, a yellow filter, and a magenta filter.

In an example embodiment, each of the plurality of pixels may include a photoelectric conversion element. For example, each of the plurality of pixels PX may include a photodiode that generates a charge in response to an optical signal incident from the outside, and a pixel circuit that generates an electrical signal corresponding to the charge generated by the photodiode. In this case, the photodiode may be a PIN photodiode having a structure in which an intrinsic semiconductor layer is inserted between PN junctions. The photodiode may also be an APD photodiode in which an avalanche layer is present between PN junctions.

In an example embodiment, each of the plurality of pixels may include at least two photodiodes. For example, each of the pixels may include at least two photodiodes to generate pixel signals corresponding to various colors of light or to provide an auto focus function.

In addition, each of the plurality of pixels may include a pixel circuit generating a pixel signal from the charge generated by the photodiodes. In this case, the pixel circuit may include a transfer transistor, a driving (source-follower) transistor, a selection transistor, a reset transistor, and at least one conversion gain transistor. The pixel circuit may obtain the pixel signal by detecting a reset voltage and a pixel voltage from the plurality of respective pixels and calculating a difference thereof. The pixel voltage may be a voltage corresponding to the charge generated in the photodiodes included in each of the plurality of pixels.

In an example embodiment, at least two pixels adjacent to each other may constitute a single pixel group. The two or more pixels included in the pixel group may share at least portions of a transfer transistor, a driving transistor, a selection transistor, a reset transistor, and a conversion gain transistor.

The row driver 120 may be implemented to drive the pixel array 110 in the unit of rows. For example, the row driver 120 may generate a transmission control signal controlling the transfer transistor of the pixel circuit, a reset control signal controlling the reset transistor, or a selection control signal controlling the selection transistor.

The readout circuit 130 may be implemented to convert an analog pixel signal generated by the pixel array 110 into a digital signal and to output the converted signal. The readout circuit 130 may include a sampling circuit and an analog-to-digital converter (ADC). The sampling circuit may include a plurality of samplers. For example, the sampler may be a correlated double sampler (CDS). The sampler may be connected to the pixels included in a row line selected by the row driver 120, through the column lines, and may detect the reset voltage and the pixel voltage from the corresponding pixels. The samplers may respectively compare the reset voltage and the pixel voltage with a ramp voltage and may output the comparison result. The analog-to-digital converter may convert the comparison result output by the samplers into a digital signal and may output the digital signal. The analog-to-digital converter may convert the reset voltage and the pixel voltage detected by the correlated double sampler into a digital signal and may transmit the converted digital signal to the column driver 140.

The column driver 140 may include an amplifier circuit and a latch or buffer circuit temporarily storing a digital signal. The column driver 140 may process the digital signal received from the readout circuit 130.

The timing controller 150 may be configured to control the operation timing of the row driver 120, the readout circuit 130, or the column driver 140. In detail, the timing controller 150 may control the operation timing to vary the conversion gain of the pixel depending on three or more operating modes. In an example embodiment, the timing controller 150 may adjust a capacitance ratio using junction capacitance or a metal capacitance around the pixel depending on the operating mode, thereby controlling the conversion gain of the pixel. The timing controller 150 may vary the size of a floating diffusion region or a charge storage region corresponding to the conversion gain by turning on/off at least one transistor in the pixel depending on an operating mode.

The image signal processor (ISP) 200 may be configured to process image data output from the readout circuit 130. For example, the image signal processor (ISP) 200 may process the image data to generate a result image, and may transmit the result image to a display or may store the result image in a memory. For example, the image signal processor (ISP) 200 may perform a signal processing operation such as color interpolation, color correction, gamma correction, color space conversion, edge correction, or the like, on received frame data, thereby generating image data.

The imaging device 10 according to an example embodiment includes an image sensor 100 having pixels controlling conversion gains according to at least three operating modes, thereby obtaining optimization in terms of a signal-to-noise ratio for each image capturing mode and a dynamic range.

Figure 2:
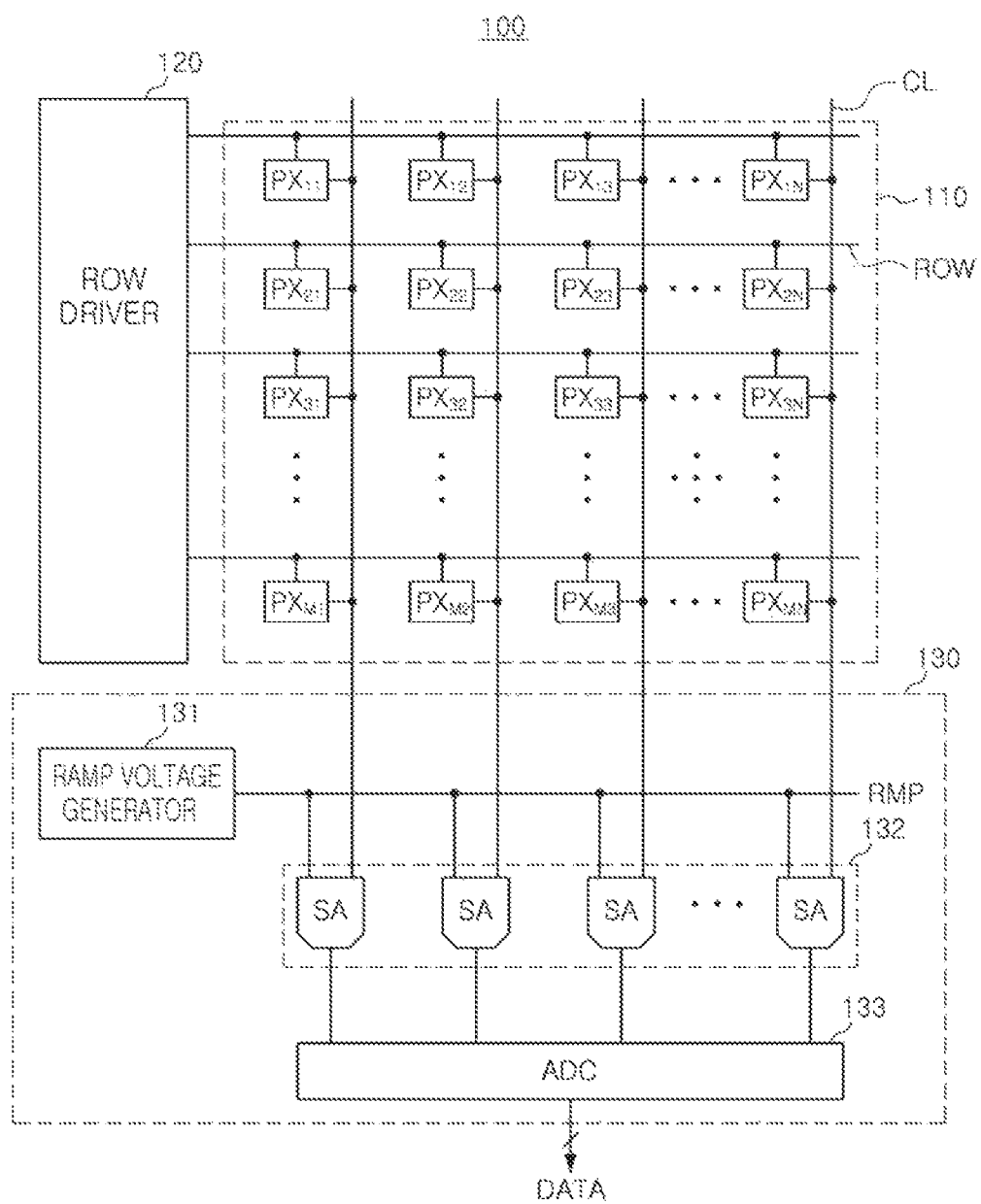
FIG. 2 is a diagram illustrating an image sensor 100 according to an example embodiment.

FIG. 2 is a diagram illustrating an image sensor 100 according to an example embodiment. Referring to FIG. 2, the image sensor 100 may include a pixel array 110, a row driver 120, and a readout circuit 130.

The pixel array 110 may include a plurality of pixels PX11-PXMN provided at intersections of a plurality of row lines ROW and a plurality of column lines CL.

The row driver 120 may input a signal required to control the plurality of pixels PX11-PXMN through the plurality of row lines ROW. For example, the row driver 120 may provide a reset control signal RG, a transmission control signal TG, or a selection control signal SEL to the plurality of pixels PX11-PXMN through the plurality of row lines ROW. The row driver 120 may sequentially select the plurality of respective row lines ROW. The row driver 120 may select one of the plurality of row lines ROW during a predetermined horizontal period.

The readout circuit 130 may include a ramp voltage generator 131, a sampling circuit 132, and an analog-to-digital converter 133. Data output from the analog-to-digital converter 133 may be input to the column driver 140 illustrated in FIG. 1.

The ramp voltage generator 131 may be configured to generate a ramp signal RMP in response to the ramp activation signal. The ramp signal RMP is a signal in which the voltage increases or decreases in proportion to time.

The sampling circuit 132 may obtain the reset voltage and the pixel voltage from some pixels connected to a row line scanned by the row driver 120 among the plurality of pixels $PX_{11}$ to $PX_{MN}$. The sampling circuit 132 may include a plurality of samplers SA, and the plurality of samplers SA may be correlated-double samplers. Each of the samplers SA may receive a ramp signal RMP of the ramp voltage generator 131 through a first input terminal, and may receive a reset voltage/pixel voltage from the plurality of pixels $PX_{11}$ to $PX_{MN}$ through a second input terminal.

The analog-digital converter 133 may output pixel data DATA by converting an analog signal of the sampling circuit 132 into a digital signal.

The image sensor 100 may have a two-layer structure. For example, a first layer may include a pixel array and a peripheral circuit such as a row decoder, a CDS, an ADC, and a second layer may include a logic circuit such as a power supply circuit, an I/O interface, an ISP, or the like. However, embodiments are not limited thereto. For example, the first layer may only include the pixel array, and the second layer may include the peripheral and logic circuits may be disposed on the second layer.

Figure 3:
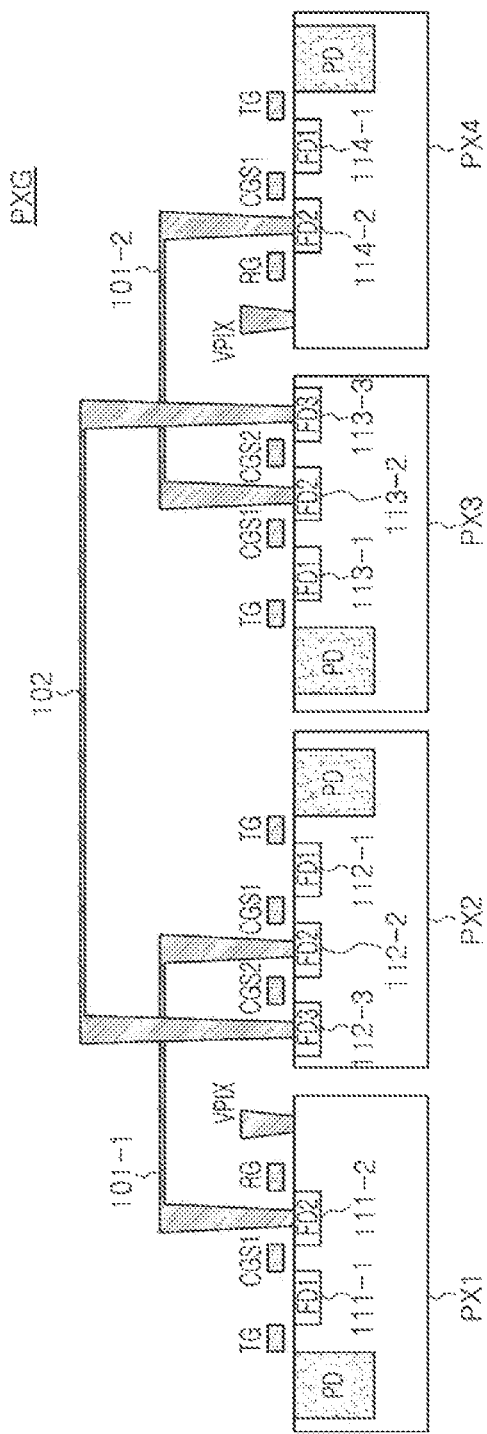
FIG. 3 is a diagram illustrating a pixel group PXG according to an example embodiment.

FIG. 3 is a diagram illustrating a pixel group PXG according to an example embodiment. Referring to FIG. 3, the pixel group PXG may include four pixels PX1, PX2, PX3 and PX4. As illustrated in FIG. 3, the pixel group PXG may include a first type of pixels PX1 and PX4 and a second type of pixels PX2 and PX3.

Each of the first type of pixels PX1 and PX4 may include a photodiode PD, a transfer transistor turned on in response to a transfer gate signal TG, a reset transistor turned on in response to a reset gate signal RG, and a first conversion gain transistor turned on in response to a first conversion gain signal CGS1. In this case, a drain of the reset transistor may be connected to a pixel driving voltage VPIX. In an example embodiment, a first floating diffusion region 111-1 or 114-1 corresponding to a first floating diffusion node FD1 may be provided between the transfer transistor and the first conversion gain transistor. In an example embodiment, a second floating diffusion region 111-2 or 114-2 corresponding to a second floating diffusion node FD2 may be provided between the first conversion gain transistor and the reset transistor. Each of the first type of pixels PX1 and PX4 may include two floating diffusion regions 111-1 and 111-2 and 114-1 and 114-2, respectively.

The first conversion gain transistor electrically connects the first floating diffusion node FD1 and the second floating diffusion node FD2 in response to the first conversion gain signal CGS1, to thereby control capacitance of the entire floating diffusion region of a corresponding pixel.

In an example embodiment, the second floating diffusion node FD2, 111-1 of a first pixel PX1 may be connected to the second floating diffusion node FD2, 112-2 of a second pixel PX2 through a metal line 101-1 (a first metal line). In an example embodiment, the second floating diffusion node FD2, 113-2 of the third pixel PX3 is connected to the second floating diffusion node FD2, 114-2 of the fourth pixel PX4 through a metal line 101-2.

Each of the second type of pixels PX2 and PX3 may include a photodiode PD, a transfer transistor turned on in response to a transfer gate signal TG, a first conversion gain transistor turned on in response to a first conversion gain signal CGS1, and a second conversion gain transistor turned on in response to a second conversion gain signal CGS2. In an example embodiment, a first floating diffusion region 112-1 or 113-1 corresponding to the first floating diffusion node FD1 may be provided between the transfer transistor and the first conversion gain transistor. In an example embodiment, a second floating diffusion region 112-2 or 113-2 corresponding to the second floating diffusion node FD2 may be provided between the first and second conversion gain transistors. In an example embodiment, a third floating diffusion region 112-3 or 113-3 corresponding to the third floating diffusion node FD3 may be provided in a drain of the second conversion gain transistor. Each of the second type of pixels PX2 and PX3 may include three floating diffusion regions 112-1, 112-2, 112-3 and 113-1, 113-2, and 113-3, respectively.

In an example embodiment, the third floating diffusion node FD3, 112-3 of the second pixel PX2 is connected to the third floating diffusion node FD3, 113-3 of the third pixel PX3 through a metal line 102 (a second metal line).

The pixel group PXG illustrated in FIG. 3 may include neighboring pixel pairs PX1-PX2, PX2-PX3 and PX3-PX4 that are symmetrically implemented, but embodiments are not limited thereto.

In an example embodiment, the first metal line 101-1 (or 101-2) and the second metal line 102 may exist in the same layer. Here, the same layer may be the first metal layer (e.g. M1) or the second metal layer (e.g. M2).

In another example embodiment, the first metal line 101-1 (or 101-2) and the second metal line 102 may exist in different layers. Here, the different layers may include a first metal layer having a first metal line 101-1 (or 101-2) and a second metal layer having a second metal line 102.

As an example, the pixel group PXG illustrated in FIG. 3 is composed of four pixels PX1 to PX4, however, embodiments are not limited thereto. The pixel group PXG according to an example embodiment may have any structure in which a pixel adjacent to a pixel having at least one conversion gain transistor is provided and floating diffusion nodes FD2 or FD3 corresponding to the conversion gain transistor are connected in the pixel adjacent to the pixel through the metal line.

Figure 4:
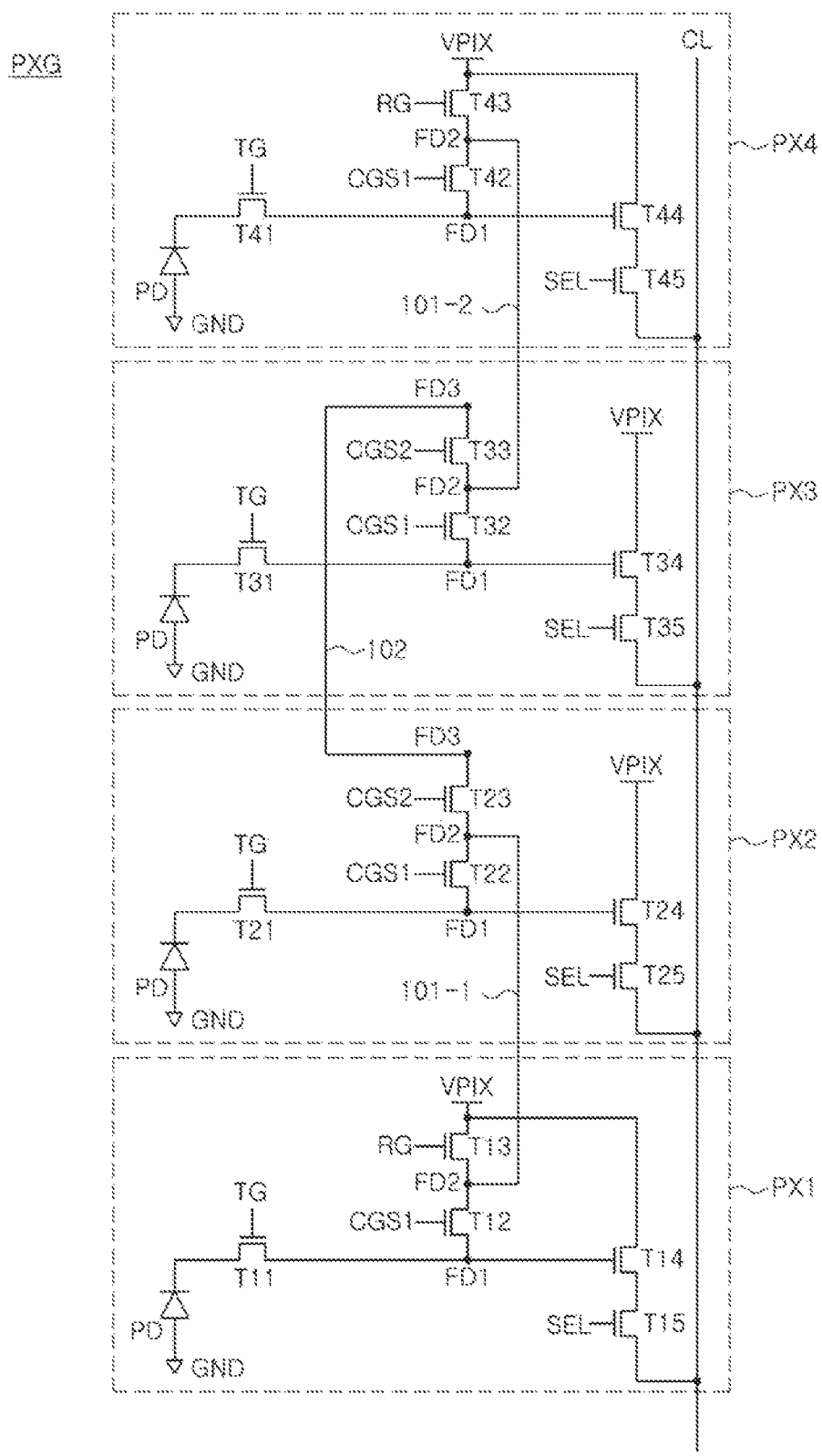
FIG. 4 is a diagram illustrating a circuit for the pixel group PXG illustrated in FIG. 3.

FIG. 4 is a diagram illustrating a circuit for the pixel group PXG illustrated in FIG. 3. Referring to FIG. 4, the pixel group PXG may include four pixels PX1 to PX4 connected to one column line CL.

The first pixel PX1 may include one photodiode PD, a first transistor T11, a second transistor T12, a third transistor T13, a fourth transistor T14, and a fifth transistor T15. The first transistor T11 may be connected between the photodiode PD and the first floating diffusion node FD1 of the first pixel PX1, and may include a gate configured to receive the transfer gate signal TG. The second transistor T12 is connected between the first floating diffusion node FD1 of the first pixel PX1 and the second floating diffusion node FD2 of the first pixel PX1, and may include a gate receiving the first conversion gain signal CGS1. The third transistor T13 may be connected between a pixel driving voltage VPIX and the second floating diffusion node FD2 of the first pixel PX1 and may include a gate configured to receive the reset gate signal RG. The fourth transistor T14 may include a drain connected to the pixel driving voltage VPIX and a gate connected to the first floating diffusion node FD1 of the first pixel PX1. The fifth transistor T15 may include a drain connected to a source of the fourth transistor T14, a source connected to the column line CL, and a gate connected to a selection signal SEL.

The second pixel PX2 may include one photodiode PD, a first transistor T21, a second transistor T22, a third transistor T23, a fourth transistor T24, and a fifth transistor T25. The first transistor T21 may be connected between the photodiode PD and the first floating diffusion node FD1 of the second pixel PX2 and may include a gate configured to receive the transfer gate signal TG. The second transistor T22 is connected between the first floating diffusion node FD1 of the second pixel PX2 and the second floating diffusion node FD2 of the second pixel PX2, and may include a gate configured to receive the first conversion gain signal CGS1. In this case, the second floating diffusion node FD2 of the second pixel PX2 may be connected to the second floating diffusion node FD2 of the first pixel PX1 through the metal line 101-1. The third transistor T23 is connected between the second floating diffusion node FD2 of the second pixel PX2 and the third floating diffusion node FD3 of the second pixel PX2, and may include a gate configured to receive the second conversion gain signal CGS2. The fourth transistor T24 may include a drain connected to the pixel driving voltage VPIX and a gate connected to the first floating diffusion node FD1 of the second pixel PX2. The fifth transistor T25 may include a drain connected to a source of the fourth transistor T24, a source connected to the column line CL, and a gate connected to the selection signal SEL.

The third pixel PX3 may include one photodiode PD, a first transistor T31, a second transistor T32, a third transistor T33, a fourth transistor T34, and a fifth transistor T35. The first transistor T31 may be connected between the photodiode PD and the first floating diffusion node FD1 of the third pixel PX3 and may include a gate configured to receive the transfer gate signal TG. The second transistor T32 is connected between the first floating diffusion node FD1 of the third pixel PX3 and the second floating diffusion node FD2 of the third pixel PX3, and may include a gate configured to receive the first conversion gain signal CGS1. The third transistor T33 is connected between the second floating diffusion node FD2 of the third pixel PX3 and the third floating diffusion node FD3 of the third pixel PX3, and may include a gate configured to receive the second conversion gain signal CGS2. The third floating diffusion node FD3 of the third pixel PX3 may be connected to the third floating diffusion node FD3 of the second pixel PX2 through the metal line 102. The fourth transistor T34 may include a drain connected to the pixel driving voltage VPIX and a gate connected to the first floating diffusion node FD1 of the third pixel PX3. The fifth transistor T35 may include a drain connected to the source of the fourth transistor T34, a source connected to the column line CL, and a gate connected to the selection signal SEL.

The fourth pixel PX4 may include one photodiode PD, a first transistor T41, a second transistor T42, a third transistor T43, a fourth transistor T44, and a fifth transistor T45. The first transistor T41 may be connected between the photodiode PD and the first floating diffusion node FD1 of the fourth pixel PX4, and may include a gate configured to receive the transfer gate signal TG. The second transistor T42 may be connected between the first floating diffusion node FD1 of the fourth pixel PX4 and the second floating diffusion node FD2 of the fourth pixel PX4, and may include a gate configured to receive the first conversion gain signal CGS1. The third transistor T43 may be connected between the pixel driving voltage VPIX and the second floating diffusion node FD2 of the fourth pixel PX4, and may include a gate configured to receive the reset gate signal RG. In this case, the second floating diffusion node FD2 of the fourth pixel PX4 may be connected to the second floating diffusion node FD2 of the third pixel PX3 through the metal line 101-2. The fourth transistor T44 may include a drain connected to the pixel driving voltage VPIX and a gate connected to the first floating diffusion node FD1 of the fourth pixel PX4. The fifth transistor T45 may include a drain connected to the source of the fourth transistor T44, a source connected to the column line CL, and a gate connected to the selection signal SEL.

Each of the pixels PX1 to PX4 illustrated in FIG. 4 includes five transistors, but the number of transistors constituting the pixel according to embodiments are not limited thereto.

Each of the pixels PX1 to PX4 illustrated in FIG. 4 is connected to one photodiode, but embodiments are not limited thereto.

Figure 5A:
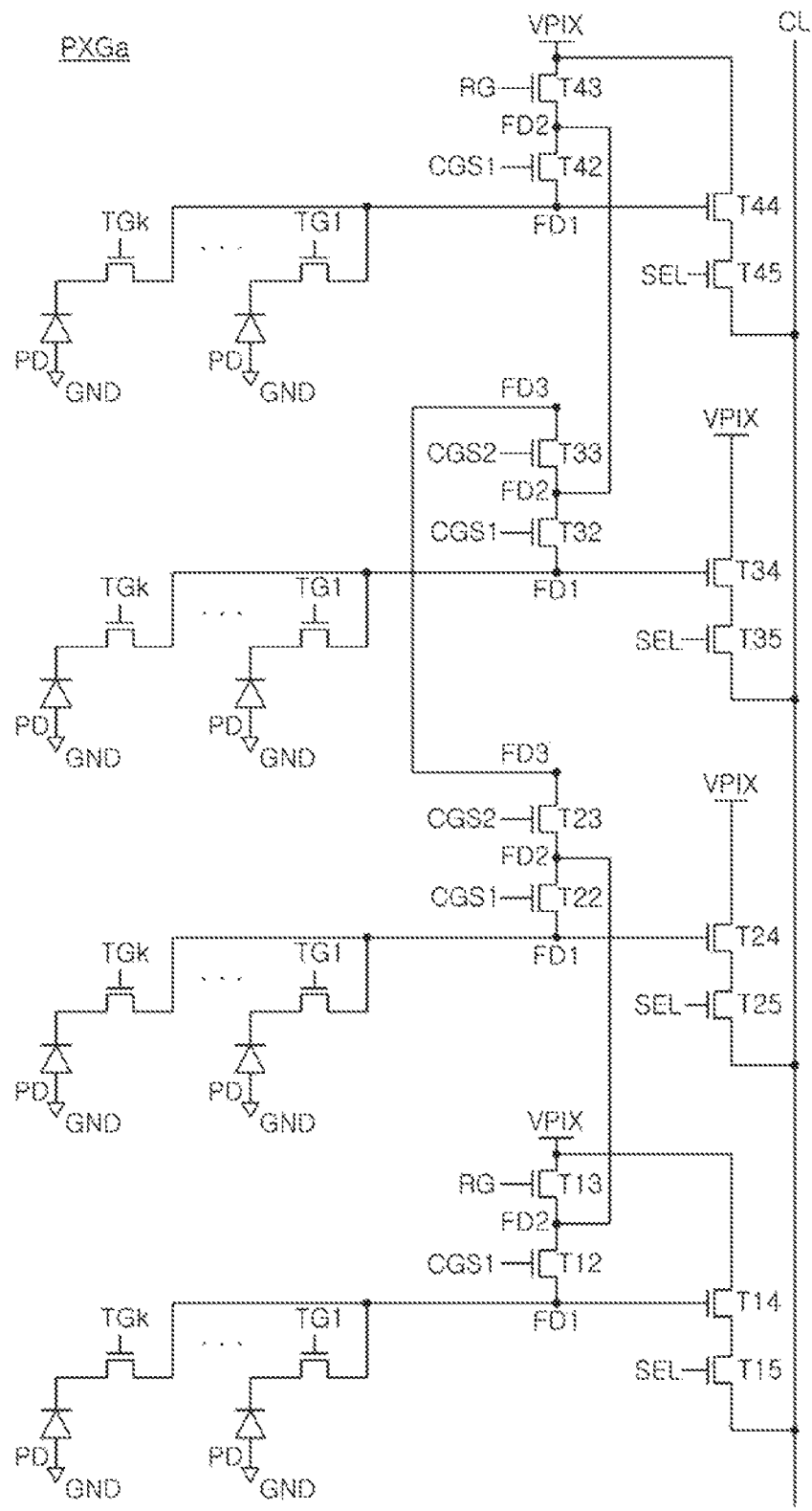
FIGS. 5A and 5B are example drawings illustrating a pixel group PXGa according to another example embodiment.
Figure 5B:
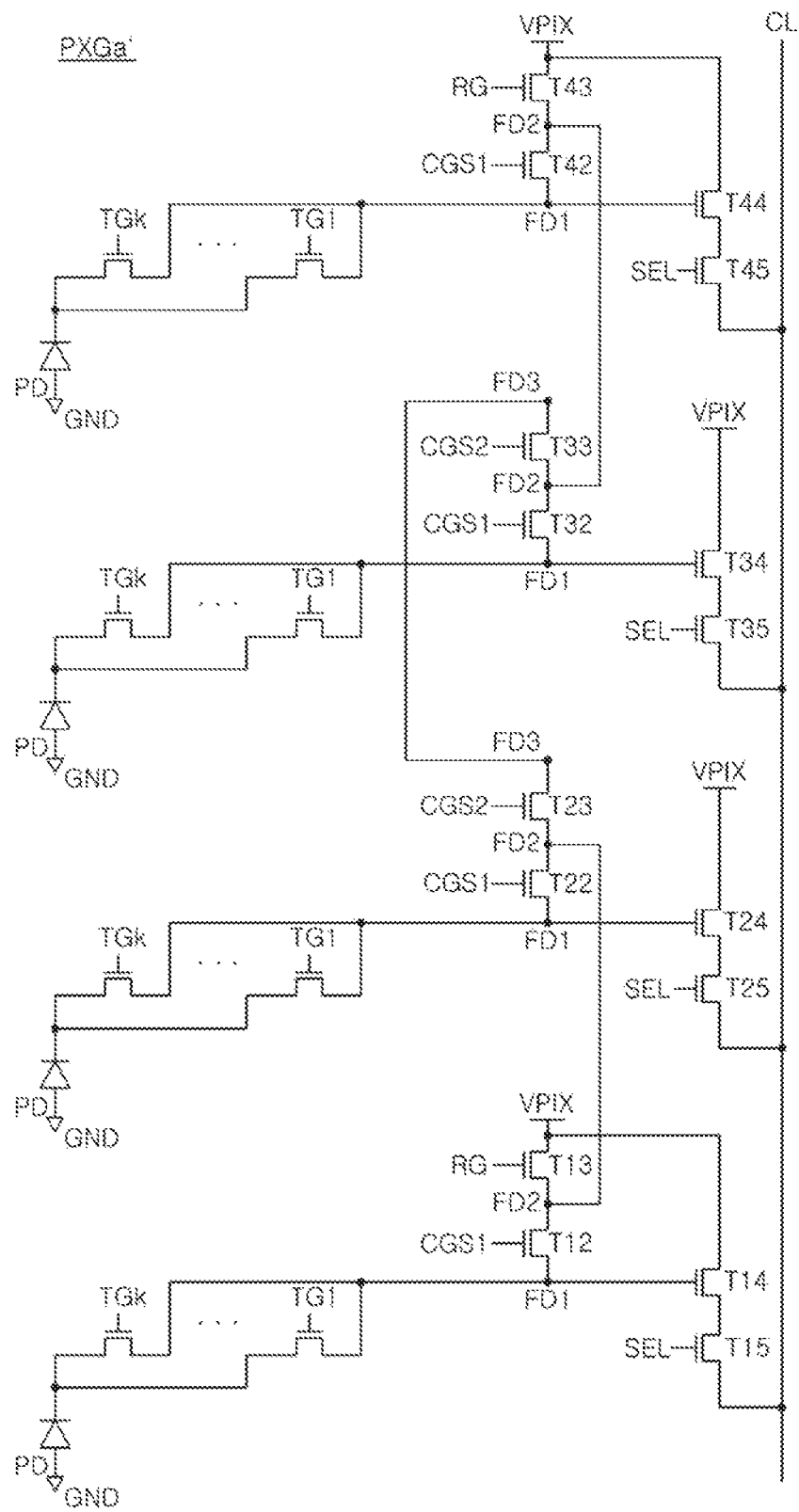

FIGS. 5A and 5B illustrate pixel groups PXGa and PXGa' according to example embodiments. Referring to FIG. 5A, the pixel group PXGa includes a plurality of photodiodes connected to the first floating diffusion node FD1 as compared to the pixel group PXG illustrated in FIG. 4. Pixels of the pixel group PXGa illustrated in FIG. 5A are pixels of a photodiode non-shared structure, and pixels of the pixel group PXGa' illustrated in FIG. 5B are pixels of a shared structure sharing one photodiode.

As illustrated in FIGS. 5A and 5B, the corresponding photodiodes in response to first transfer gate signal TG1 through k (an integer greater than or equal to 2) transfer gate signal TGk may be connected to the corresponding floating diffusion node.

In the case of each of the pixel groups PXG, PXGa and PXGa' illustrated in FIGS. 4, 5A and 5B, a plurality of pixels are connected to one column line CL, but embodiments are not limited thereto. In the pixel group according to an example embodiment, each pixel may also be connected to each column line.

Figure 6:
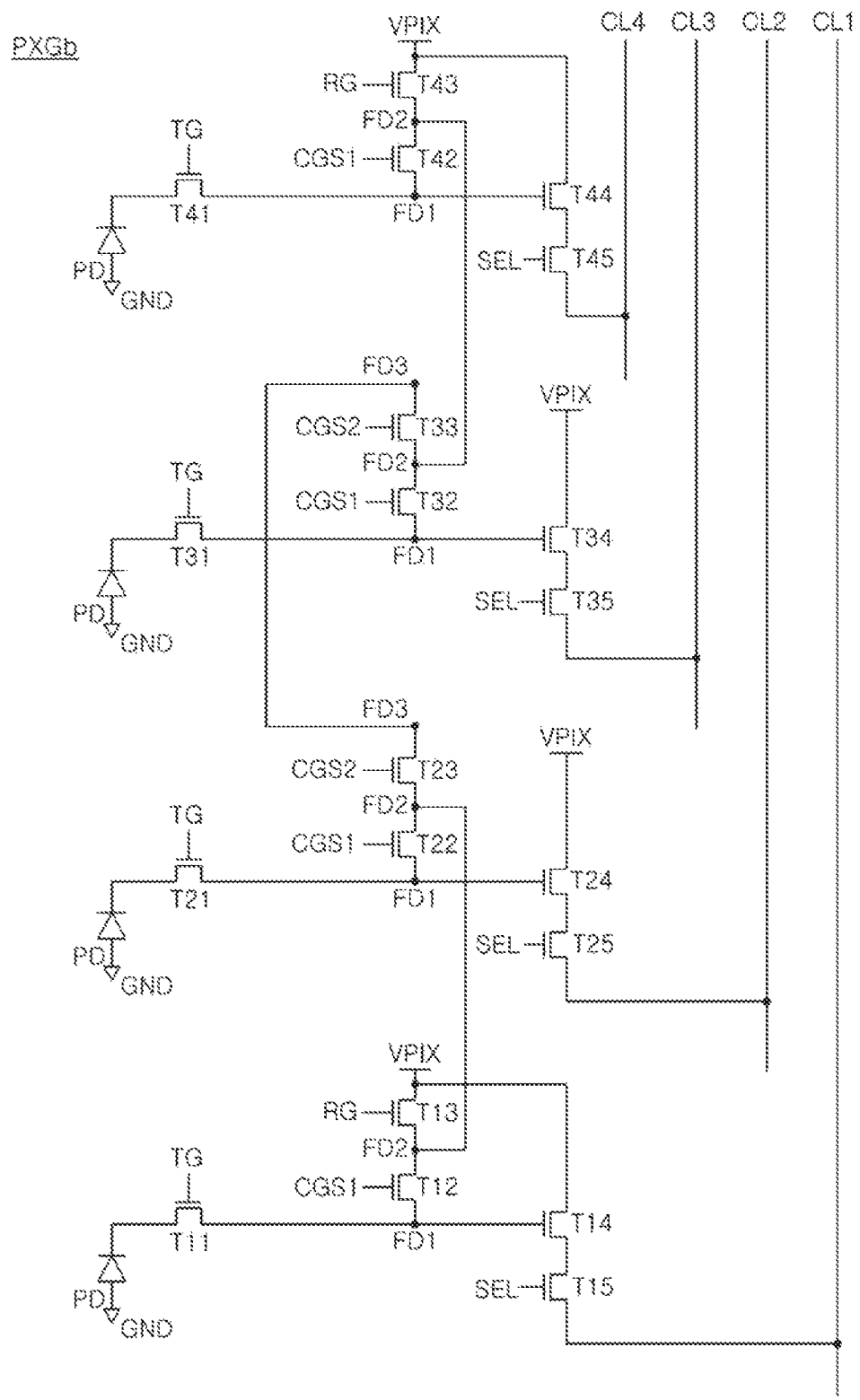
FIG. 6 is a diagram illustrating a pixel group PXGb according to another example embodiment.

FIG. 6 is a diagram illustrating a pixel group PXGb according to another example embodiment. Referring to FIG. 6, the pixel group PXGb may include output terminals of selection transistors of corresponding pixels connected to column lines CL1 to CL4, respectively, as compared to the pixel group PXG illustrated in FIG. 4. For example, the pixels of the pixel group PXGb may be connected to corresponding column lines, respectively.

Each of the pixel groups PXG, PXGa and PXGb illustrated in FIGS. 3 to 6 includes a pixel and a neighboring pixel implemented in a symmetrical structure, but embodiments are not limited thereto. For example, the pixel groups may also be implemented to have pixels with the same structure.

Figure 7:
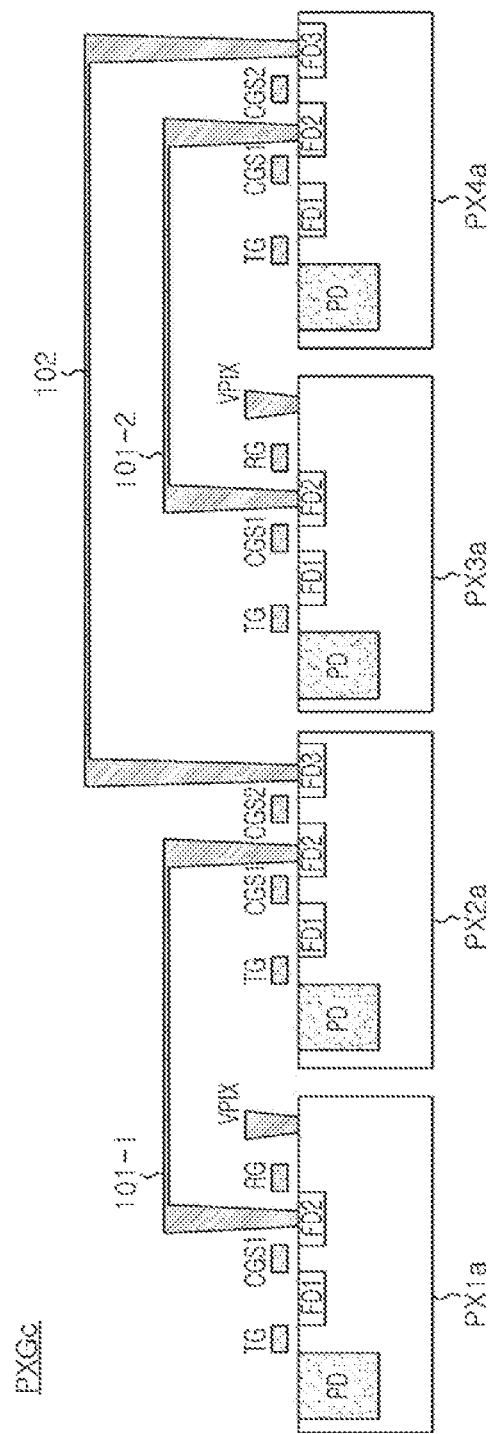
FIG. 7 is a diagram illustrating a pixel group PXGc according to another example embodiment.

FIG. 7 is a diagram illustrating a pixel group PXGc according to another example embodiment. Referring to FIG. 7, the pixel group PXGc may include fourth pixels PX1*a*, PX2*a*, PX3*a* and PX4*a* which respectively have the same structure.

Each of the pixel groups PXG, PXGa, PXGb and PXGc illustrated in FIGS. 3 to 7 includes four pixels, but the number of pixels included in the pixel groups according embodiments are not limited thereto.

The pixel groups according to example embodiments may be implemented with various color patterns.

Figures 8A, 8B, 8C:
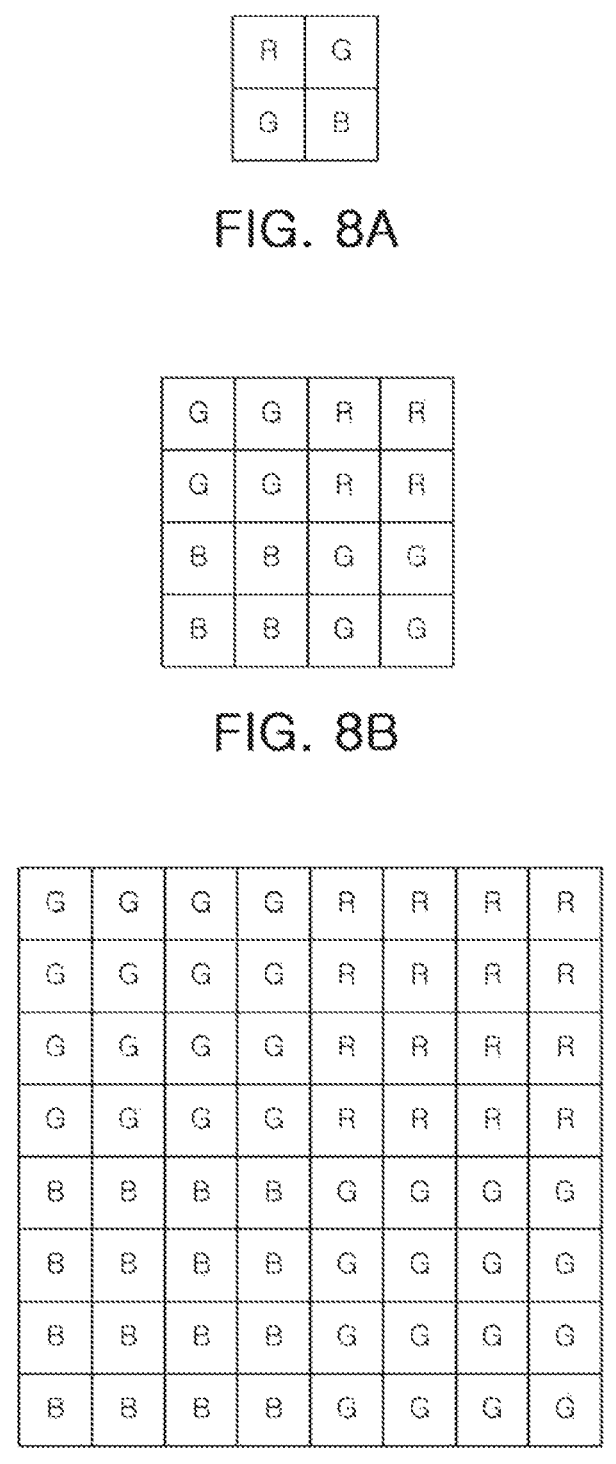

FIG. 8A is a drawing illustrating a pixel composed of a 2×2 bayer pattern, FIG. 8B is a drawing illustrating a pixel composed of a 4×4 tetra pattern, FIG. 8C is a drawing illustrating a pixel composed of an 8×8 Q-cell pattern, and FIG. 8D is a diagram illustrating a pixel having an infrared light (IR) subpixel.

The Bayer patterns illustrated in FIGS. 8A, 8B, 8C and 8D includes a red subpixel R, a blue subpixel B, and a green subpixel G, but embodiments are not limited thereto. The bayer patterns according to an example embodiment may be variously configured by appropriately disposing a red subpixel R, a blue subpixel B, a green subpixel G, or a white subpixel W.

The pixel groups according to an example embodiment may include lenses of various sizes.

Figure 9C:
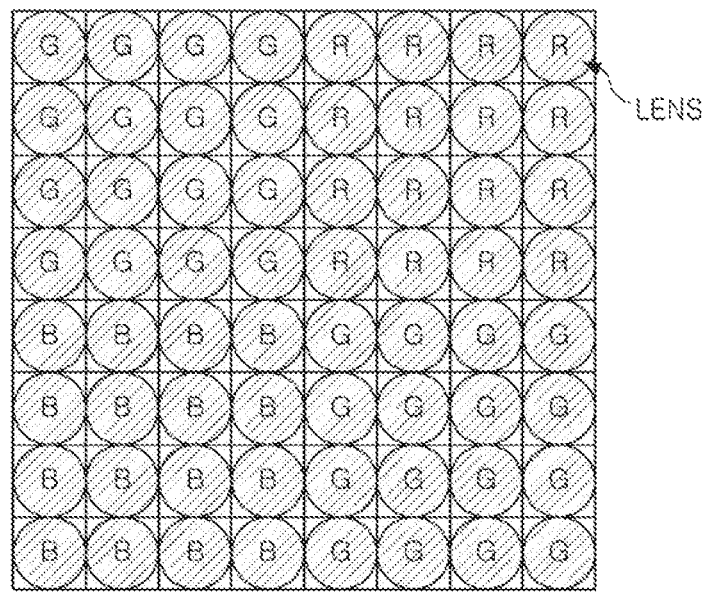
FIG. 9C illustrates a 4×4 color filter pixel having a lens corresponding to a 1×1 subpixel.
Figure 9D:
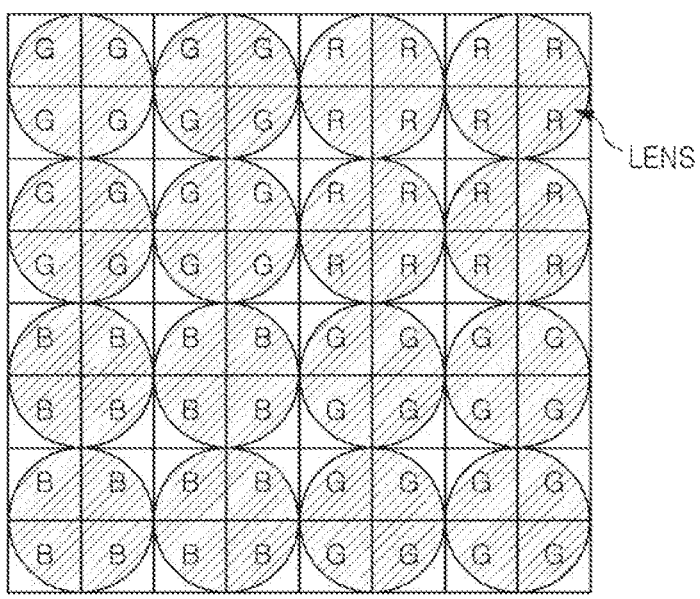
FIG. 9D illustrates a 4×4 color filter pixel corresponding to a 2×2 subpixel.
Figure 9E:
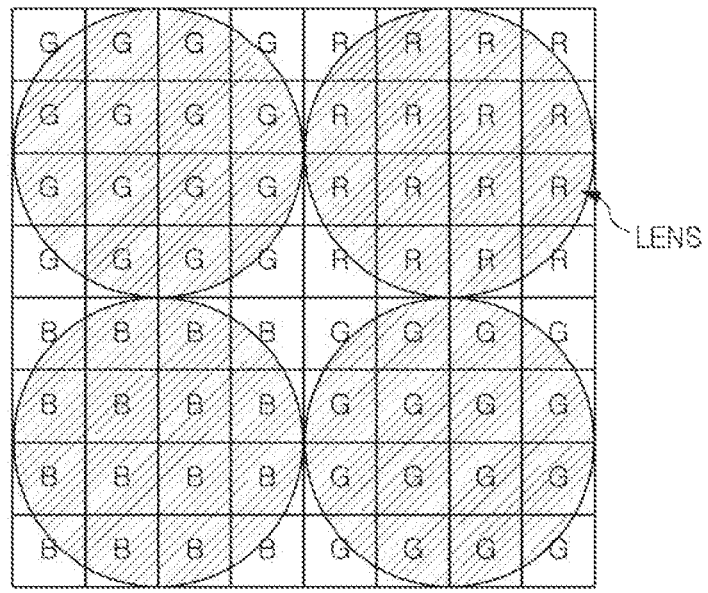
FIG. 9E illustrates a 4×4 color filter pixel corresponding to a 4×4 subpixel.

FIG. 9A illustrates a tetrapixel having a lens corresponding to each color subpixel, FIG. 9B illustrates a tetrapixel having a lens corresponding to four same color subpixels, FIG. 9C illustrates a 4×4 color filter pixel having a lens corresponding to a 1×1 subpixel, FIG. 9D illustrates a 4×4 color filter pixel corresponding to a 2×2 subpixel, and FIG. 9E illustrates a 4×4 color filter pixel corresponding to a 4×4 subpixel.

The pixels and the sizes of the lenses corresponding thereto illustrated in FIGS. 9A, 9B, 9C, 9D and 9E are only provided as examples.

The pixel according to an example embodiment may be implemented in a 2-PD structure sharing one floating diffusion region.

Figure 10A:
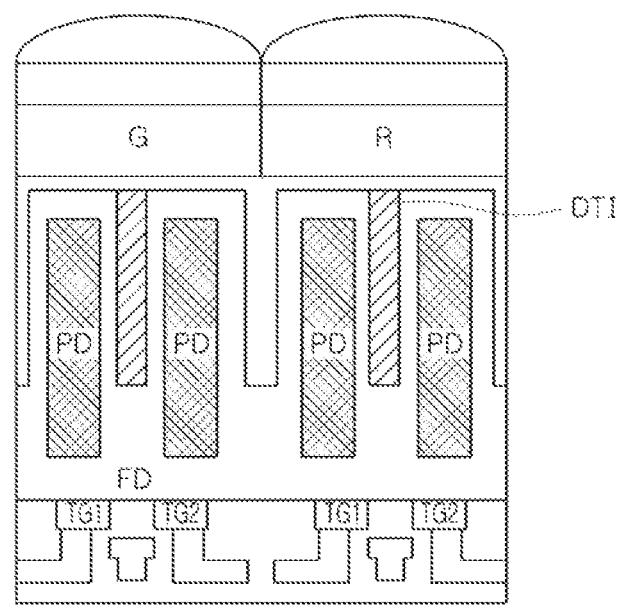
FIGS. 10A and 10B are drawings illustrating pixels of a 2-PD structure.
Figure 10B:
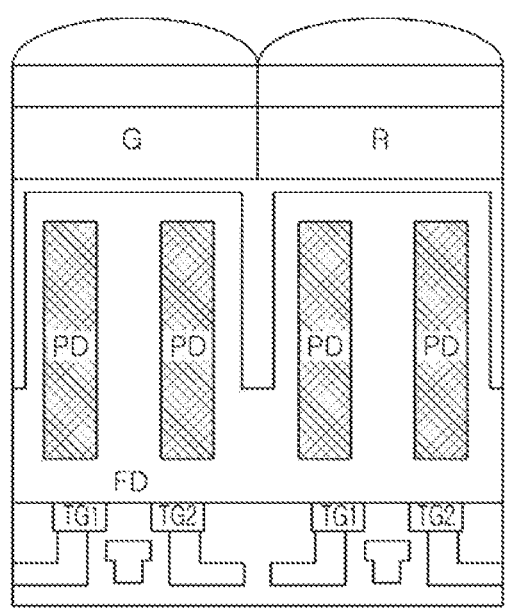

FIGS. 10A and 10B are drawings illustrating pixels of a 2-PD structure. Referring to FIG. 10A, the 2-PD pixel separates a left PD from a right PD by in-pixel deep trench isolation (DTI). Referring to FIG. 10B, the 2-PD pixel separates a left PD from a right PD by a PN junction.

A floating diffusion region FD may be connected to a pair of left PDs and a pair of right PDs disposed in the pixel. For example, the first floating diffusion region FD1 may be commonly connected to four photoelectric conversion elements. The floating diffusion region FD may include, for example, N-type impurities. The first transfer gate TG1 and the second transfer gate TG2 disposed on a substrate of a first pixel PX1 and the first transfer gate TG1 and the second transfer gate TG2 disposed on a substrate of a second pixel PX2 may share the floating diffusion region FD.

An image sensor according to an example embodiment may control the conversion gain signals CGS1 and CGS2 differently depending on an operating mode.

Figure 11A:
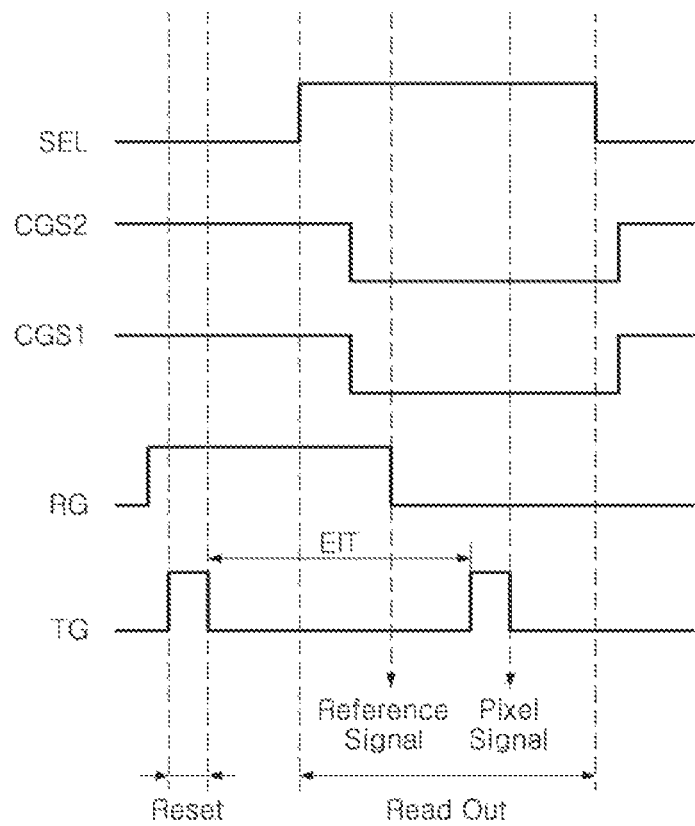
FIG. 11A is an operation timing diagram of a pixel according to a first operating mode.
Figure 11B:
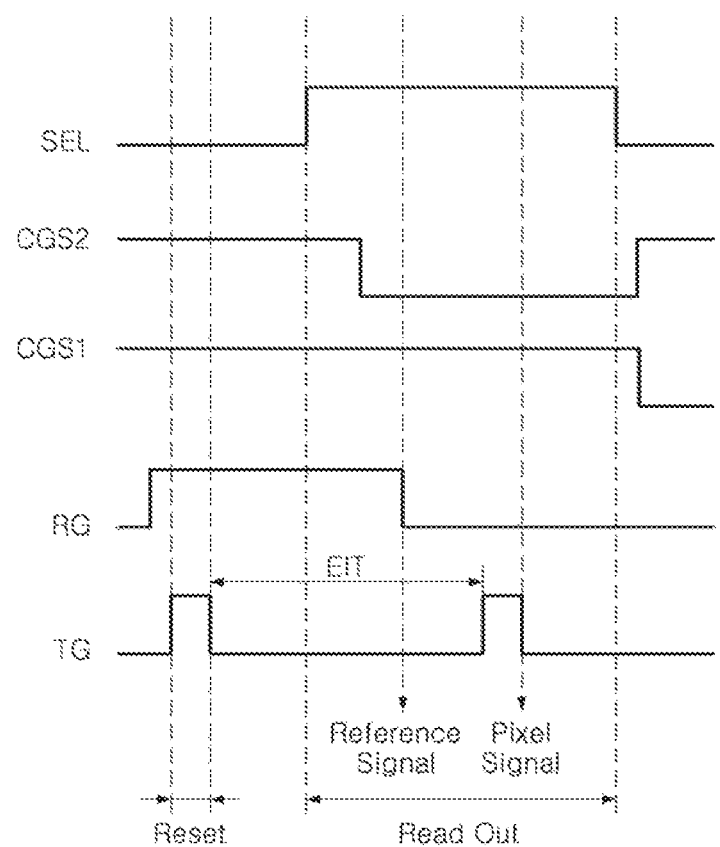
FIG. 11B is an operation timing diagram of a pixel according to a second operating mode.
Figure 11C:
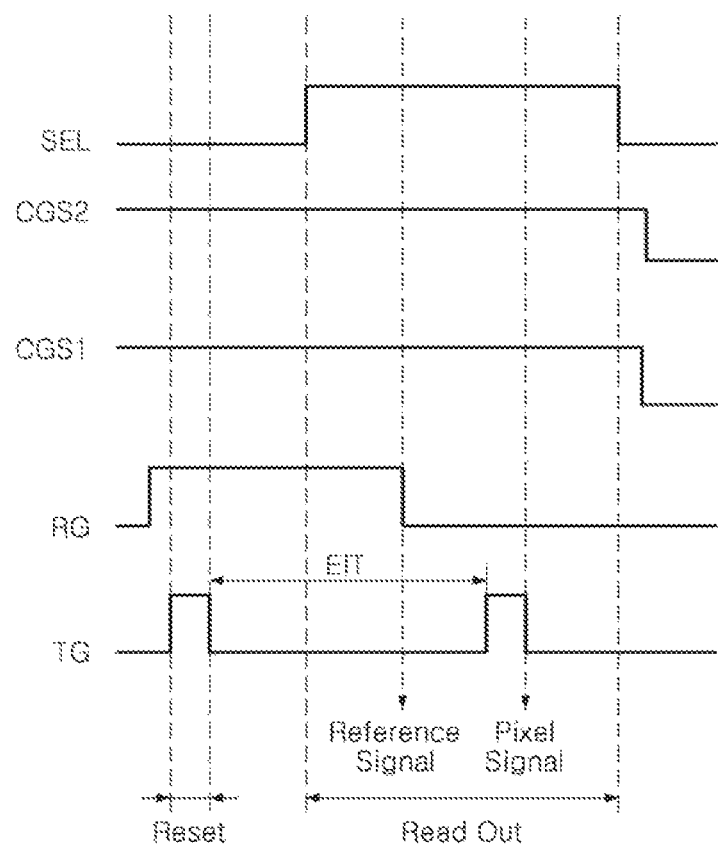
FIG. 11C is an operation timing diagram of a pixel according to a third operating mode.

FIG. 11A is an operation timing diagram of a pixel based on a first operating mode, FIG. 11B is an operation timing diagram of a pixel based on a second operating mode, and FIG. 11C is an operation timing diagram of a pixel based on a third operating mode.

In a reset mode, by activating the reset gate signal RG, the charge transfer gate signal TG, and the first conversion gain signal CGS1 and the second gain conversion signal CGS2, the reset transistor T13 illustrated in FIG. 4 or the transfer transistor T11 illustrated in FIG. 4 may be turned on. Accordingly, the pixel driving voltage VPIX is provided to the first floating diffusion node FD1, and the charges of the photodiode PD and the floating diffusion node FD may be initialized. Thereafter, photocharges are generated and accumulated in the photodiode PD until the transfer transistor T11 is turned off and then turned on again, for example, during the photoelectric conversion time, in an optical integration mode EIT.

In an example embodiment, the control gain may be varied for each unit pixel by controlling the first conversion gain signal CGS1 and the second gain conversion signal CGS2 depending on an operating mode of the imaging device 10 as illustrated in FIG. 1. For example, FIG. 11A is a timing diagram having a conversion gain corresponding to the first floating diffusion node FD1 according to the first operating mode, FIG. 11B is a timing diagram having a conversion gain corresponding to the first floating diffusion node FD1 and the second floating diffusion node FD2 according to the second operating mode. FIG. 11C is a timing diagram having a conversion gain corresponding to the first floating diffusion node FD1, the second floating diffusion node FD2, and the third floating diffusion node FD3 according to the third operating mode.

According to an example embodiment, depending on the control of the first conversion gain signal CGS1 and the second gain conversion signal CGS2, the size of the floating diffusion region corresponding to the operating pixel may be determined.

As described above, after controlling the conversion gain of the first pixel and the second pixel, the reset gate signal RG is deactivated, and at this time, the reference signal may be output by detecting the reset potential of the first floating diffusion node FD1. Thereafter, after outputting the reference signal, the charge transfer gate signal TG may be activated. Accordingly, photocharges integrated in the photodiode PD may be transferred to the first floating diffusion node FD1. After the transfer gate signal TG is deactivated, the pixel signal may be output by detecting a potential of the first floating diffusion node FD1.

Figure 12:
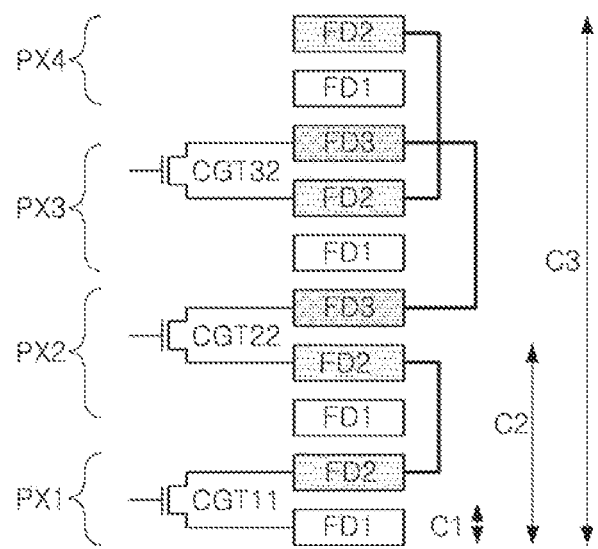
FIG. 12 is a diagram illustrating a change in capacitance depending on connection of floating diffusion nodes FD1, FD2 and FD3 of pixels PX1 to PX4 of a pixel group according to an example embodiment.

FIG. 12 is a diagram illustrating a change in capacitance depending on connection of floating diffusion nodes FD1, FD2 and FD3 of pixels PX1, PX2, PX3, and PX4 of a pixel group according to an example embodiment. FIG. 12 illustrates a case in which the second floating diffusion node FD2 of the first pixel PX1 and the second floating diffusion node FD2 of the second pixel PX2 are connected through a metal line, the second floating diffusion node FD2 of the third pixel PX3 and the second floating diffusion node FD2 of the fourth pixel PX4 are connected through a metal line, and the third floating diffusion node FD3 of the second pixel PX2 and the third floating diffusion node FD3 of the third pixel PX3 are connected through a metal line. The connection between the floating diffusion nodes using at least one metal line according to embodiments are not limited thereto.

When a first conversion gain transistor CGT11 of the first pixel PX1 is turned off in the first operating mode, the first capacitance C1 corresponding to the first floating diffusion node FD1 of the first pixel PX1 may be formed.

According to the second operating mode, the first conversion gain transistor CGT11 of the first pixel PX1 is turned on and a second conversion gain transistor CGT22 of the second pixel PX2 is turned off, a second capacitance C2 corresponding to the first floating diffusion node FD1 of the first pixel PX1, the second floating diffusion node FD2 of the first pixel PX1, and the second floating diffusion node FD2 of the second pixel PX2 may be formed. In this case, the second floating diffusion node FD2 of the first pixel PX1 and the second floating diffusion node FD2 of the second pixel PX2 may be connected through a metal line.

According to the third operating mode, the first conversion gain transistor CGT11 of the first pixel PX1 is turned on, the second conversion gain transistor CGT22 of the second pixel PX2 is turned on, and a second conversion gain transistor CGT32 of the third pixel PX2 is turned on, a third capacitance C3, corresponding to the first floating diffusion nodes FD1 and the second floating diffusion node FD2 of the first pixel PX1, the second floating diffusion nodes FD2 and the third floating diffusion node FD3 of the second pixel PX2, the second floating diffusion nodes FD2 and the third floating diffusion node FD3 of the third pixel PX3, and the second floating diffusion node FD2 of the fourth pixel PX4, may be formed.

FIGS. 11A, 11B and 11C are examples, and embodiments are not limited thereto. For example, the reset gate signal RG and the selection signal SEC may be changed in various on/off times.

As illustrated in FIG. 12, various capacitances used for pixel operations may be formed depending on on/off operations of the conversion gain transistors connecting the floating diffusion nodes of respective pixels.

Figure 13A:
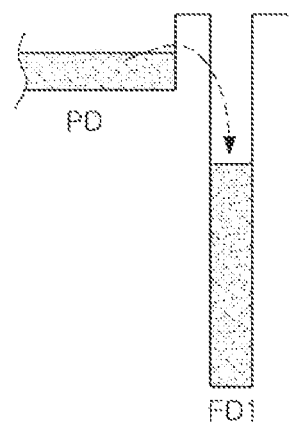
FIG. 13A is a diagram illustrating a size FD1 of a floating diffusion region corresponding to a pixel according to a first operating mode.
Figure 13B:
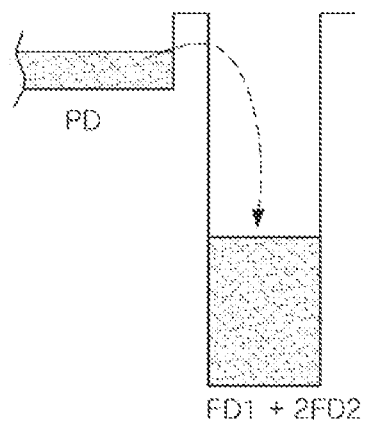
FIG. 13B is a size (FD1+2FD2) of a floating diffusion region corresponding to a pixel according to a second operating mode.
Figure 13C:
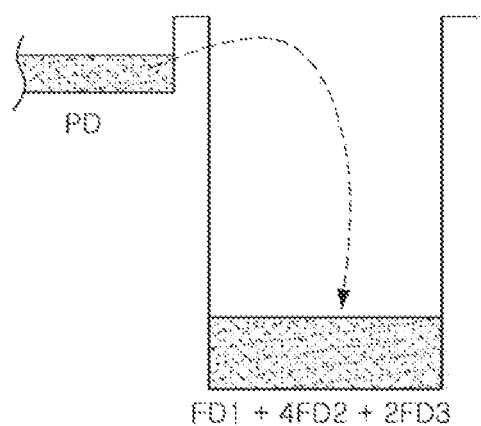
FIG. 13C is a drawing illustrating a size (FD1+4FD+2FD3) of the floating diffusion region corresponding to a pixel according to a third operating mode.

FIG. 13A is a diagram illustrating a size FD1 of a floating diffusion region corresponding to a pixel according to a first operating mode, FIG. 13B is a drawing illustrating a size (FD1+2FD2) of a floating diffusion region corresponding to a pixel according to a second operating mode, and FIG. 13C is a drawing illustrating a size (FD1+4FD+2FD3) of a floating diffusion region corresponding to a pixel according to a third operating mode. As illustrated in FIGS. 13A, 13B and 13C, the size of the floating diffusion region may vary depending on an operating mode. The change in the size of the floating diffusion region may change the level of the voltage converted depending on the same amount of charge transferred from the photodiode FD, which indicates adjustment of a conversion gain.

The image sensor 100 according to an example embodiment may have an optimal conversion gain by varying the size of the floating diffusion region depending on three or more operating modes.

Figure 14A:
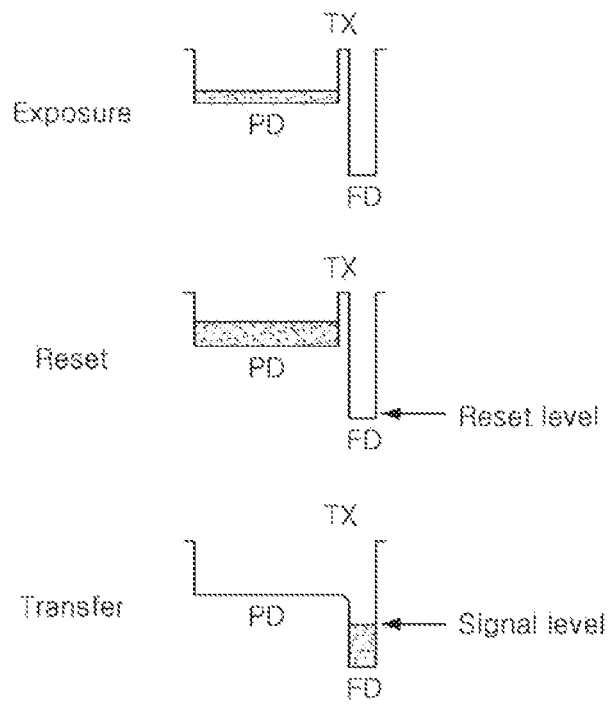
FIG. 14A is a diagram illustrating a process of generating an image signal in unit pixels in an image capturing mode in chronological order.
Figure 14B:
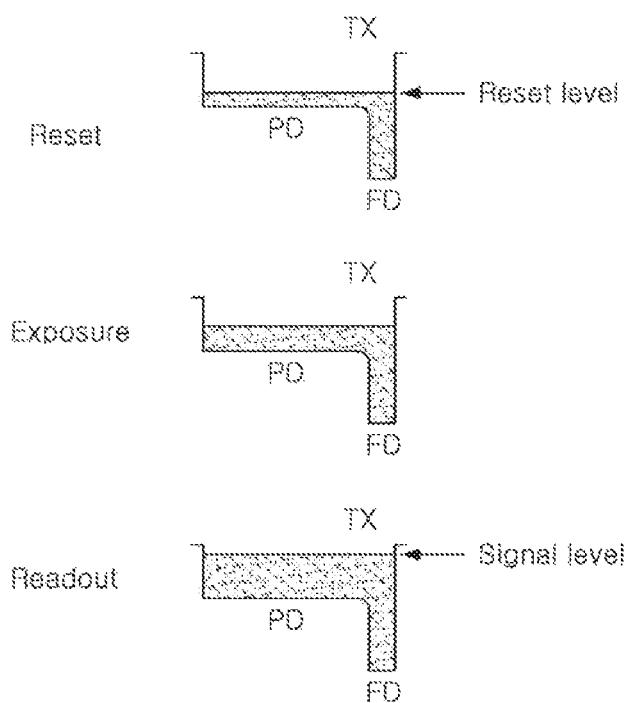
FIG. 14B is a diagram of a process of generating an image signal in unit pixels in an image recognition mode in chronological order.

FIG. 14A is a diagram illustrating a process of generating an image signal in unit pixels in an image capturing mode in chronological order, and FIG. 14B is a diagram of a process of generating an image signal in unit pixels in an image recognition mode in chronological order.

As illustrated in FIG. 14A, the pixel circuit may generate an image signal through a process of exposure, reset, and transfer in the image capturing mode. First, after the reset transistor RX and the transfer transistor TX are turned on, the reset transistor RX and the transfer transistor TX may be turned off and exposed to light. At this time, the selection transistor SX is turned on to read the reset voltage level. Thereafter, the transfer transistor TX may be turned on to transfer the photocharge generated in the photodiode PD to the FD node for a predetermined time, thereby reading the signal voltage level. In this case, to transfer all the charges of the photodiode PD to the FD node, it is necessary to reset the FD node to a relatively high power supply voltage. In this case, when the high power supply voltage is used, power consumption may increase. The difference between the read signal voltage level and the reset voltage level may be an image signal of a circuit of a pixel corresponding to light input for a predetermined time.

As illustrated in FIG. 14B, in the image recognition mode, the pixel circuit may generate an image signal through a process of reset, exposure, and readout. As illustrated in FIG. 14B, in the image recognition mode, the transfer transistor TX may be always on. Accordingly, the photodiode PD and the FD node may be conductive. In the image recognition mode, a method of reading the voltage of electrons accumulated in the photodiode PD and the FD node may be used without using an electron transfer method that is an operation method of the pixel circuit in the image capturing mode. Hereinafter, a method of reading the voltage of electrons accumulated in the photodiode PD and the FD node in the pixel circuit in the image recognition mode will be described.

Referring to FIG. 14B, since a direct current voltage is applied to the transfer transistor TX and the transfer capacitor TX is always turned on, the electron potentials of the photodiode PD and the FD node are the same. At this time, even when the DC voltage is applied to the transfer transistor TX, since no current flows through the gate of the transfer transistor TX, power consumption at the gate of the transfer transistor TX may be zero.

First, the reset transistor RX may set the FD node conducted with the photodiode PD to a reset voltage level using a low power supply voltage. The pixel circuit may then be exposed to light for a period of time. The selection transistor may be turned on to obtain the signal voltage level of the FD node changed by the incident light. As such, the difference between the read signal voltage level and the reset voltage level may be an image signal of a circuit of a pixel corresponding to light input for a predetermined time. Unlike the electron transfer method in the image capturing mode, it is not necessary to ensure a high reset voltage for charge transfer in the image recognition mode, and thus, reset through a relatively low voltage may be performed, and similarly, the voltage of the source follower may also be lowered and the image signal may be read even when the charge is stepped down.

In the pixel group described with reference to FIGS. 3 to 14, any pixel and neighboring pixels have different structures, but embodiments are not limited thereto. The pixel groups according to an example embodiment may be implemented with pixels having the same configuration.

Figure 15A:
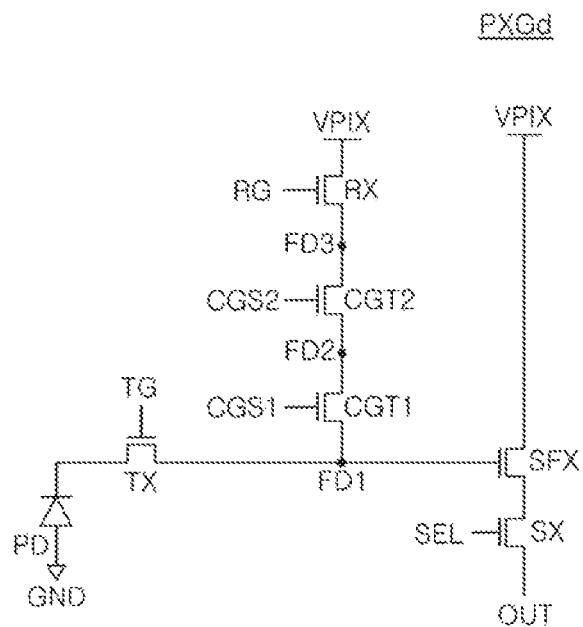
FIGS. 15A, 15B and 15C are drawings illustrating pixels PXGd, PXGe and PXGf according to another example embodiment.
Figure 15B:
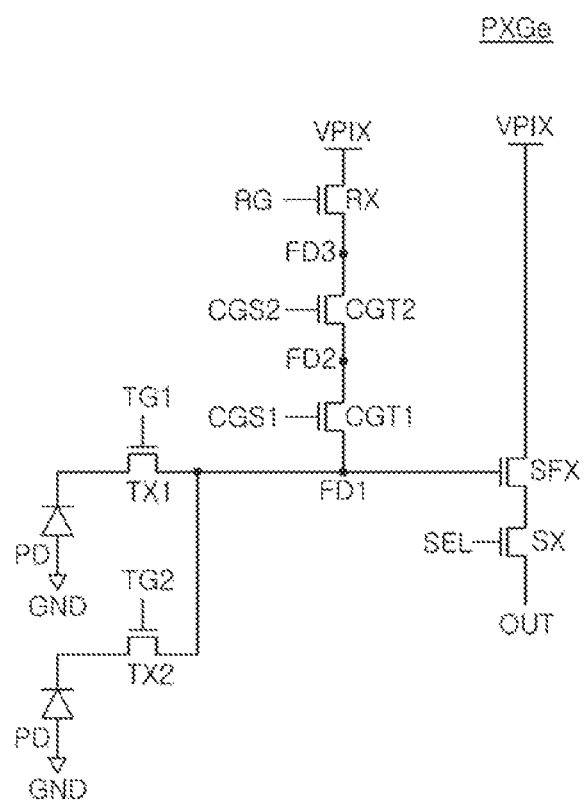
Figure 15C:
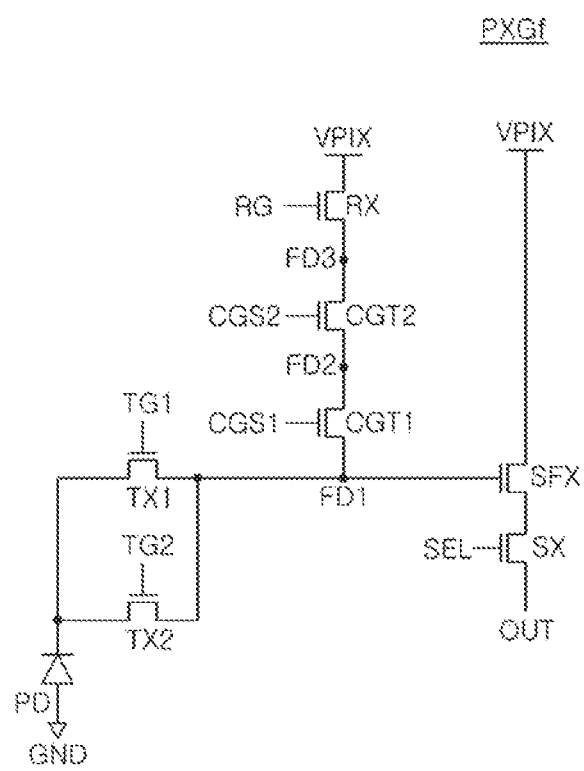

FIGS. 15A, 15B and 15C are drawings illustrating pixels PXGd, PXGe, and PXGf according to another example embodiment.

Referring to FIG. 15A, the pixel PXGd may include a transfer transistor TX, a source follower transistor SFX, a selection transistor SX, a reset transistor RX, and conversion gain transistors CGT1 and CGT2. The transfer transistor TX may connect the photodiode PD and the first floating diffusion node FD1 in response to the transfer gate signal TG. The source follower transistor SFX may provide the pixel driving voltage VPIX to the drain of the selection transistor SX in response to the voltage of the first floating diffusion node FD1. The selection transistor SX may connect the drain of the source follower transistor SFX and the output terminal OUT in response to the selection signal SEL. The reset transistor RX may connect the power supply terminal providing the pixel driving voltage VPIX and the third floating diffusion node FD3 in response to the reset gate signal RG. The first conversion gain transistor CGT1 may connect the first floating diffusion node FD1 and the second floating diffusion node FD2 in response to the first conversion gain signal CGS1. The second conversion gain transistor CGT2 may connect the second floating diffusion node FD2 and the third floating diffusion node FD3 in response to the second conversion gain signal CGS2.

The pixel PXGd according to an example embodiment may obtain the appropriate conversion gain by controlling the conversion gain signals CGS1 and CGS2 depending on an operating mode by varying the size of the floating diffusion region.

Referring to FIG. 15B, two photodiodes may be connected to the first floating diffusion node FD1 of the pixel PXGe. The two photodiodes may be connected to the first floating diffusion node FD1 by the transfer transistors TX1 and TX2, respectively, turned on in response to the corresponding transfer gate signals TG1 or TG2.

Referring to FIG. 15C, one photodiode may be connected to the first floating diffusion node FD1 of the pixel PXGf. One photodiode may be connected to the first floating diffusion node FD1 by the transfer transistors TX1 and TX2 that are turned on in response to the transfer gate signals TG1 or TG2.

Figure 16:
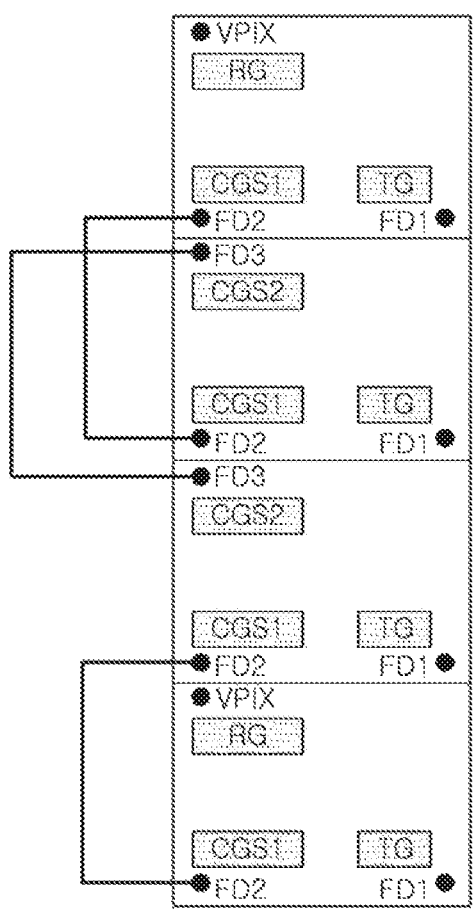
FIG. 16 is a diagram illustrating an example embodiment of layout arrangement of pixel groups according to an example embodiment.

FIG. 16 is a diagram illustrating a layout arrangement of pixel groups according to an example embodiment. Referring to FIG. 16, in respective pixels, a gate of a transfer transistor receiving a transfer gate signal TG is disposed on a lower right side, a gate of a first conversion gain transistor receiving a first conversion gain signal CGS1 is disposed on a lower left side, and on an upper left side, a gate of the reset transistor receiving the reset gate signal RG may be disposed or a gate of the second conversion gain transistor receiving the second conversion gain signal CGS2 may be disposed.

In an example embodiment, the first floating diffusion node FD1 may be disposed near the gate of the transfer transistor, the second floating diffusion node FD2 may be disposed near the gate of the first conversion gain transistor, the third floating diffusion node FD3 may be disposed near the gate of the second conversion gain transistor, and a power terminal receiving the pixel driving voltage VPIX may be disposed near the gate of the reset transistor.

The arrangement of gates/power terminals/floating diffusion nodes of the transistors illustrated in FIG. 16 is merely an example.

The image sensor according to an example embodiment may include a plurality of pixel arrays.

Figure 17:
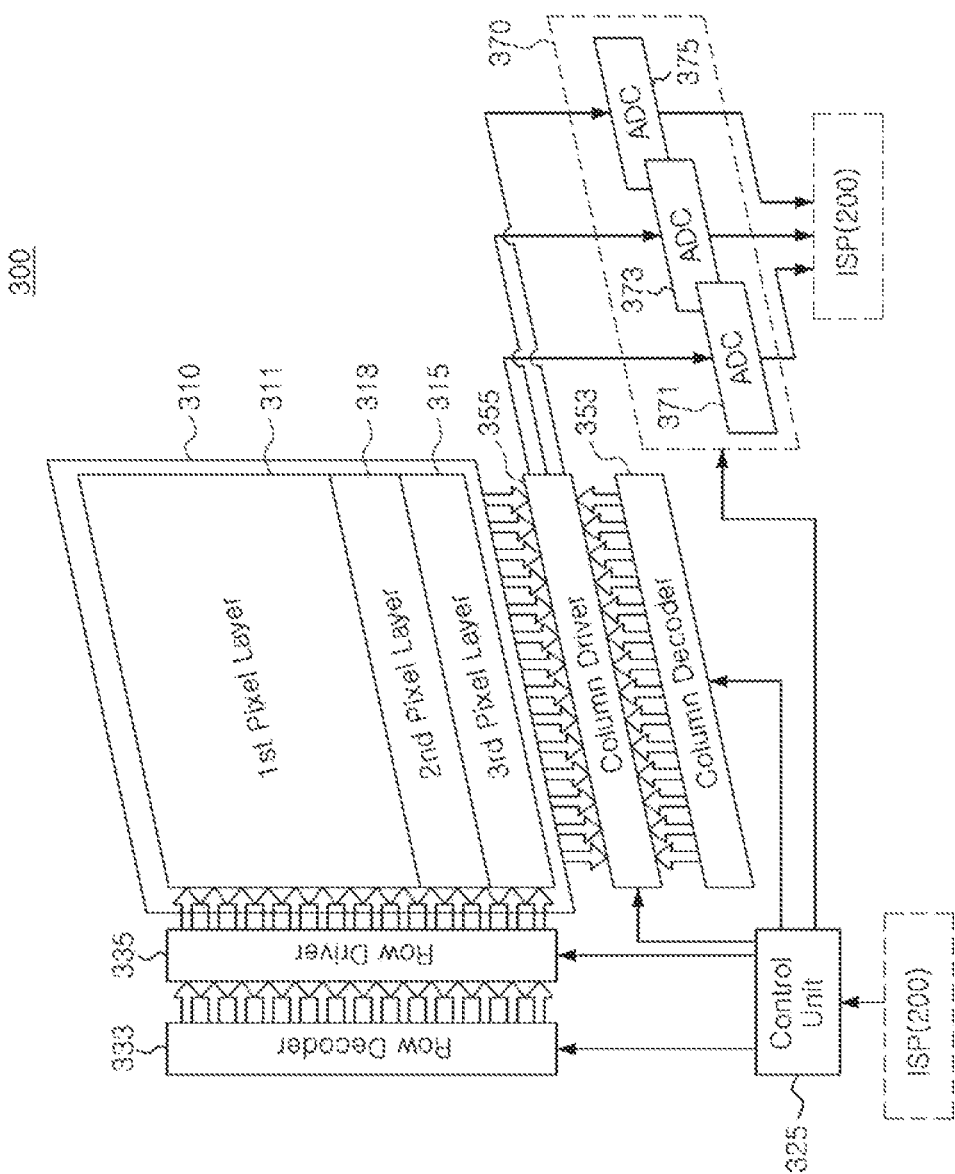
FIG. 17 is a diagram illustrating an image sensor 300 according to another example embodiment.

FIG. 17 is a diagram illustrating an image sensor 300 according to another example embodiment. Referring to FIG. 17, the image sensor 300 includes a pixel array 310, a control unit 325, a row decoder 333, a row driver 335, a column decoder 353, a column driver 355, and an ADC 370.

The pixel array 310 may detect light reflected from a subject to generate object information OBI1 and/or image information IMI of the subject. The pixel array 310 may include a plurality of pixels arranged in the form of a two-dimensional matrix. The pixel array 310 may include a plurality of pixel layers 311, 313 and 315. In an example embodiment, first pixel array 311 may be a color pixel array (CPA). For example, the color pixel array may have pixels of a Bayer pattern. In an example embodiment, second pixel array 313 may be a depth pixel array (DPA). For example, the depth pixel array may include a plurality of 2-PD pixels or metal shield pixels. In an example embodiment, the second pixel array 313 may include at least one temperature sensor to perform depth correction depending on temperature. In an example embodiment, third pixel array 315 may be a thermal pixel array (TPA). For example, the thermal pixel array may include a plurality of temperature pixels.

The number of pixel arrays according to embodiments are not limited thereto. The pixel array according to an example embodiment may include at least two pixel layers to perform different functions.

The control unit 325 may generate a control signal or control signals to control respective operations of the row decoder 333, the row driver 335, the column decoder 353, the column driver 355, and the plurality of ADCs 371, 373 and 375. For example, the control unit 325 may generate a plurality of row control signals for selecting a specific row line among a plurality of row lines included in each of a plurality of stacked pixel layers 311, 313 and 315. In an example embodiment, the control unit 325 may be disposed on a layer different from that of the pixel array 310.

The row decoder 333 may decode a plurality of row control signals, for example, row address signals output from the control unit 325, and may output a plurality of row selection signals according to the decoding result. The row driver 335 may drive pixels included in at least one row from among a plurality of rows included in the plurality of respective pixel layers 311, 313 and 315 in response to the plurality of respective row selection signals output from the row decoder 333.

The column decoder 353 may decode a plurality of column control signals, for example, column address signals output from the control unit 325, and may output a plurality of column selection signals according to the decoding result. The column driver 355 may drive a plurality of respective column lines included in the plurality of respective pixel layers 311, 313 and 315 in response to the plurality of respective column selection signals output from the column decoder 353.

The image sensor 300 illustrated in FIG. 17 includes one row driver 335 and one column driver 355, however embodiments are not limited thereto. According to an example embodiment, the image sensor 300 may include a plurality of row drivers or a plurality of column drivers for driving row lines or column lines of the plurality of respective pixel layers 311, 313 and 315. The image sensor 300 may include a plurality of row decoders or a plurality of column decoders.

Each of the plurality of ADCs 371, 373, and 375 analog-to-digital converts signals output from the plurality of respective pixel layers 311, 313 and 315, and may output the analog-to-digital converted signals as image data to the image signal processor (ISP) 200. For example, the image data may include object information or image information.

According to an example embodiment, each of the plurality of ADCs 371, 373, and 375 may further include a correlated double sampling (CDS) circuit performing correlated double sampling on signals output from the plurality of respective pixel layers 311, 313 and 315. In this case, each of the plurality of ADCs 371, 373 and 375 may compare the correlated double sampled signal and the ramp signal and may output the comparison result as image data.

The image signal processor (ISP) 200 may process the image data such that the image data may be displayed. In addition, the image signal processor (ISP) 200 may control the control unit 325 such that the image sensor 300 has an optimal conversion gain depending on the operating mode as described above with reference to FIGS. 1 to 17.

Figure 18:
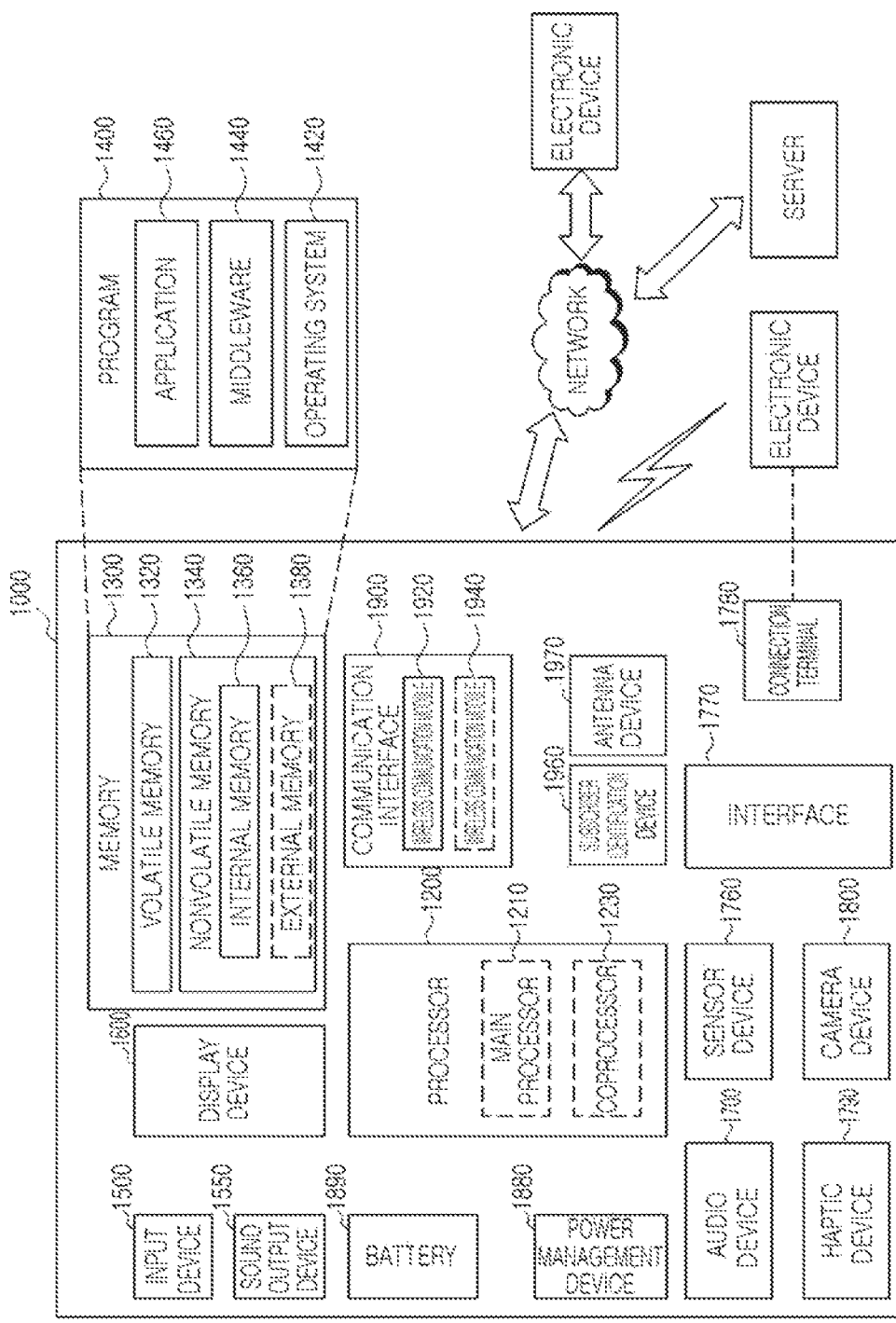
FIG. 18 is a block diagram of an electronic device 1000 according to an example embodiment.

FIG. 18 is a block diagram illustrating an electronic device 1000 according to an example embodiment. In a network environment, the electronic device 1000 may communicate with other electronic devices through a first network, for example, short-range wireless communications, or another electronic device or a server through a second network, for example, long-range wireless communications.

Referring to FIG. 18, the electronic device 1000 may include a processor 1200, a memory 1300, an input device 1500, a sound output device 1550, a display device 1600, an audio device 1700, and a sensor device 1760, an interface 1770, a haptic device 1790, a camera device 1800, a power management device 1880, a battery 1890, a communication interface 1900, a subscriber identification device 1960, and an antenna device 1970. According to an example embodiment, at least one of the components may be omitted or another component may be added to the electronic device 1000. For example, the display device 1600 may be implemented by integrating some components, such as in the case of an embedded sensor device 1760 a fingerprint sensor, an iris sensor, or an illuminance sensor.

The processor 1200 drives software, for example, a program 1400, to control at least one other component, for example, a hardware or software component, of the electronic device 1000 connected to the processor 1200, and may perform various data processing and operations.

The processor 1200 loads and processes a command or data received from another component, for example, the sensor device 1760 and the communication interface 1900 into a volatile memory 1320, and may store the result data in a nonvolatile memory 1340.

In an example embodiment, the processor 1200 may operate independently of a main processor 1210, for example, a central processing unit or an application processor, and additionally/alternatively, may include a coprocessor 1230, for example, a graphics processing processor, an image signal controller, a sensor hub processor, a communication processor, an artificial intelligence processor, using less power than the main processor 1210 or specialized in specified functions.

The coprocessor 1230 may be operated separately from the main processor 1210 or by being embedded. The coprocessor 1230 may replace the main processor 1210 while the main processor 1210 is in an inactive or sleep state or may operate together with the main processor 1210 while the main processor 1210 is in an active state or application execution state, to control at least a portion of functions or states associated with at least one, for example, the display device 1600, the sensor device 1760, or the communication interface 1900, of the components of the electronic device 1000. In an example embodiment, the coprocessor 1230 may be implemented as a portion of functionally-related other components, for example, the camera device 1800 or the communication interface 1900.

The memory 1300 may store various data used by at least one component, for example, the processor 1200 or the sensor device 1760, of the electronic device 1000, for example, software, and input data or output data for instructions related thereto. The memory 1300 may include a volatile memory 1320 or a nonvolatile memory 1340.

The program 1400 is software stored in the memory 1300 and may include an operating system 1420, middleware 1440, or an application 1460.

The input device 1500 is a device for receiving a command or data to be used for a component, the processor 1200, of the electronic device 1000 from an external user of the electronic device 1000, and for example, may include a microphone, a mouse or a keyboard.

The sound output device 1550 is a device for outputting an audio signal to the outside of the electronic device 1000. For example, the sound output device 1550 may include a speaker used for general usage, such as multimedia playback or recording playback, and a receiver used only for receiving a call. In an example embodiment, the receiver may be formed integrally or separately from the speaker.

The display device 1600 may be implemented to visually provide information to a user of the electronic device 1000. For example, the display device 1600 may include, for example, a display, a hologram device, a projector, and a control circuit controlling the device. In an example embodiment, the display device 1600 may include touch circuitry or a pressure sensor that may measure the strength of the pressure on the touch.

The audio device 1700 may bidirectionally convert a sound and an electrical signal. In an example embodiment, the audio device 1700 acquires sound through the input device 1500, or may output sound through the sound output device 1550 or an external electronic device, for example, a speaker or a headphone, connected to the electronic device 1000 in a wired or wireless manner.

The sensor device 1760 may generate an electrical signal or data value corresponding to an internal operating state such as a power state or the temperature of the electronic device 1000 or an external environmental state. For example, the sensor device 1760 may include a gesture sensor, a gyro sensor, an air pressure sensor, a magnetic sensor, an acceleration sensor, a grip sensor, a proximity sensor, a color sensor, an infrared (IR) sensor, a biometric sensor, a temperature sensor, a humidity sensor, or an illumination sensor.

The interface 1770 may support a designated protocol that may be connected to an external electronic device by wire or wirelessly. In an example embodiment, the interface 1770 may include a high definition multimedia interface (HDMI), a universal serial bus (USB) interface, an SD card interface, or an audio interface.

A connection terminal 1780 may include a connector, for example, an HDMI connector, a USB connector, an SD card connector, or an audio connector such as a headphone connector to physically connect the electronic device 1000 and an external electronic device.

The haptic device 1790 may convert an electrical signal into an electrical stimulus or a mechanical stimulus such as vibrations or movement, that may be perceived by the user through the sense of touch or movement. The haptic device 1790 may include, for example, a motor, a piezoelectric element, or an electrical stimulation device.

The camera device 1800 may be configured to capture still images and videos. In an example embodiment, the camera device 1800 may include one or more lenses, an image sensor, an image signal controller, or a flash. The camera device 1800 may control the pixels that optimally select the conversion gain depending on three or more operating modes as described in FIGS. 1 through 17.

The power management device 1880 is a device for managing power supplied to the electronic device 1000, and may be configured, for example, as at least a portion of a power management integrated circuit (PMIC). The battery 1890 is a device supplying power to at least one component of the electronic device 1000 and may include, for example, a non-rechargeable primary battery, a rechargeable secondary battery, or a fuel cell.

The communication interface 1900 may support establishment of a wired or wireless communication channel between the electronic device 1000 and an external electronic device and communication through the established communication channel. The communication interface 1900 may include one or more communication processors supporting wired or wireless communication, which are operated independently of the processor 1200 which may be an application processor.

According to an example embodiment, the communication interface 1900 may include a wireless communication interface 1920, for example, a cellular communication interface, a short range wireless communication interface, or a global navigation satellite system (GNSS) communication interface, or a wired communication interface 1940, for example, a local area network (LAN) communication interface, or a power line communication interface. The communication interface 1900 may communicate with an external electronic device through a first network, for example, a short-range communication network such as Bluetooth, Wi-Fi direct, or infrared data association (IrDA), or a second network, for example, a telecommunication network such as a cellular network, Internet, or a computer network (LAN or WAN), using a corresponding wired/wireless communication interface. In an example embodiment, the communication interface 1900 may be implemented in one chip or in separate chips.

In an example embodiment, the wireless communication interface 1920 may distinguish and authenticate the electronic device 1000 in a communication network using user information stored in the subscriber identification device 1960.

The antenna device 1970 may include one or more antennas for transmitting or receiving signals or power to or from the outside. In an example embodiment, the communication interface 1900 may transmit a signal to or receive a signal from an external electronic device through an antenna suitable for a communication method.

Some of the components are connected to each other via a communication method between peripheral devices, for example, a bus, a general purpose input/output (GPIO), a serial peripheral interface (SPI), or a mobile industry processor interface (MIPI), to exchange a signal, for example, commands or data, with each other.

In an example embodiment, the command or data may be transmitted or received between the electronic device 1000 and an external electronic device through a server connected to the second network. The electronic devices may respectively be the same or different type of device as or from the electronic device 1000. According to an example embodiment, all or part of operations executed in the electronic device 1000 may be executed in another or a plurality of external electronic devices. According to an example embodiment, when the electronic device 1000 is to perform a function or service automatically or by request, the electronic device 1000 may request that the external electronic device perform at least some related functions, instead of or in addition to executing the function or service by itself. Upon receiving the request, the external electronic device may execute the requested function or additional function and may transmit the result to the electronic device 1000. The electronic device 1000 may provide the requested function or service by processing the received result as it is or additionally. To this end, for example, cloud computing, distributed computing, or client-server computing technology may be used.

The electronic device 1000 may be various types of devices. For example, the electronic device 1000 may include at least one of a portable communication device, for example, a smartphone, a computer device, a portable multimedia device, a portable medical device, a camera, a wearable device, or a home appliance.

As used herein, the term device may include a unit composed of hardware, software, or firmware, and may be used interchangeably with terms such as logic, logic blocks, components, or circuits. The device may include various embodiments in document of integrally constructed components, which may be implemented in software, for example, the program 1400, including the instructions stored in machine, for example, a computer-readable storage media such as an internal memory 1360 or external memory 1380. The device may be a device capable of calling a stored command from a storage medium and operating according to the called command, and may include an electronic device, for example, the electronic device 1000 according to the example embodiments. When an instruction is executed by a processor, for example, the processor 1200, the processor may perform a function corresponding to the instruction directly by the processor or by using other components under the control of the processor. The instruction may include code generated or executed by a compiler or interpreter. The machine-readable storage medium may be provided in the form of a non-transitory storage medium. In this case, 'non-transitory' means that the storage medium does not include a signal and is tangible, but does not distinguish that data is stored semi-permanently or temporarily on the storage medium.

Figure 19A:
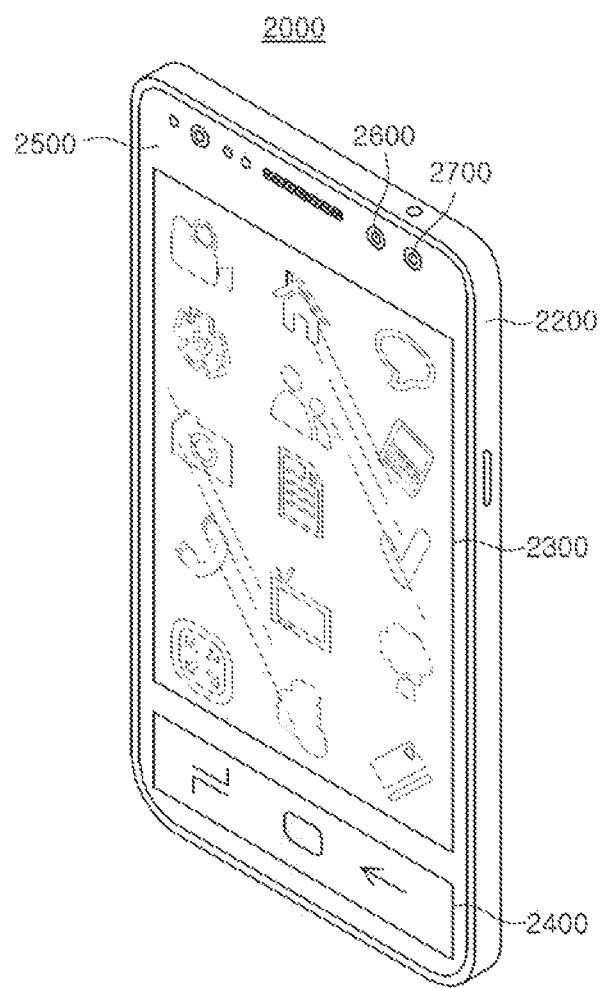
FIGS. 19A and 19B are diagrams schematically illustrating a mobile device 2000 according to an example embodiment.
Figure 19B:
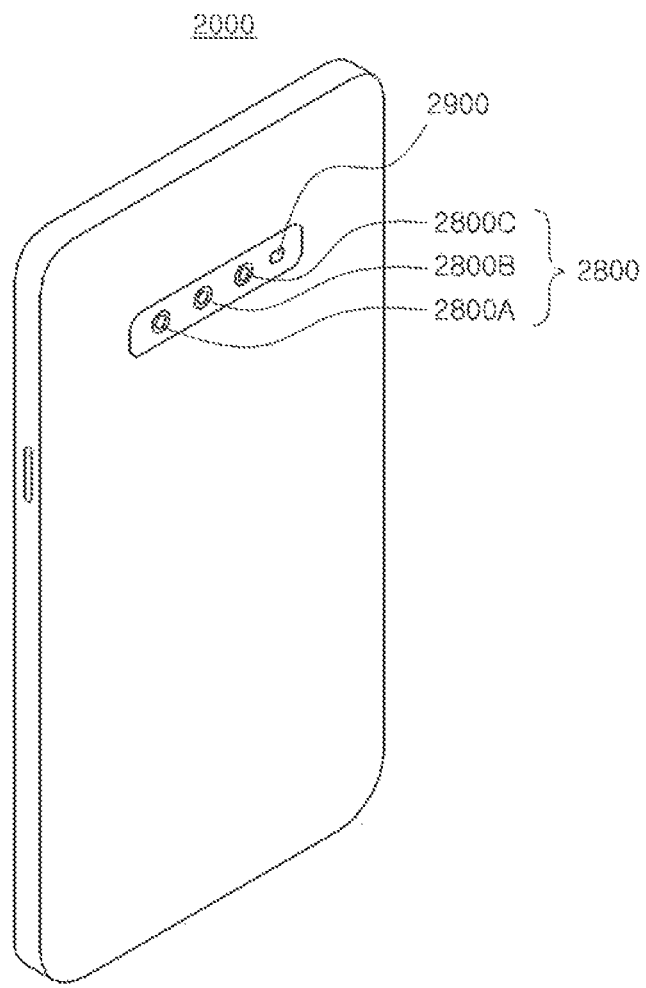

FIGS. 19A and 19B are diagrams schematically illustrating a mobile device 2000 according to an example embodiment. Referring to FIGS. 19A and 19B, the mobile device 2000 may include a housing 2200, a display 2500, cameras 2600, 2700 and 2800, and the like. According to an example embodiment, the display 2500 may substantially cover the entire front surface of the housing 2200, and depending on an operating mode of the mobile device 2000 or an application being executed, the display 2500 may include a first area 2300, a second area 2400, and the like to operate.

Referring to FIG. 19A, front cameras 2600 and 2700 may include a first front camera 2600 and a second front camera 2700 having different characteristics. For example, the first front camera 2600 and the second front camera 2700 may have different aperture values, focal lengths, angle of views, and the like. In this case, the first front camera 2600 may be a general camera, and the second front camera 2700 may be a time-of-flight (ToF) camera. When the second front camera 2700 is a ToF camera, the second front camera 2700 may be combined with a separate light source to provide functions such as distance measurement, depth map generation, and face recognition.

Referring to FIG. 19B illustrating a rear surface of the mobile device 2000, the mobile device 2000 may include a rear camera 2800 and a light emitting unit 2900. Similarly to the front cameras 2600 and 2700, the rear camera 2800 may include a plurality of rear cameras 2800A to 2800C in which at least one of an aperture value, an angle of view, and a pixel number of an image sensor are different from each other. The light emitting unit 2900 may employ a light emitting diode (LED) or the like as a light source and may operate as a flash in an application using the rear camera 2800.

Each of the plurality of cameras 2600, 2700 and 2800 may include a lens, an image sensor, a motor, and an engine. In this case, the image sensor may be implemented by pixels varying the conversion gain depending on the operating mode as described with reference to FIGS. 1 to 17.

The image sensor may provide RGB data based on a clock signal. For example, the image sensor may interface with the engine through a mobile industry processor interface (MIPI) or a camera serial interface (CSI). The motor may adjust the focus of the lens or perform shuttering in response to the control signal received from the engine. The engine may control the image sensor and the motor. The engine may also generate YUV data including a luminance component, a difference between the luminance component and a blue component, and a difference between the luminance component and a red component, based on RGB data received from the image sensor, or may generate compressed data, for example, Joint Photography Experts Group (JPEG) data. The engine may be connected to a host/application, and the engine may provide YUV data or JPEG data to the host/application based on a master clock. In addition, the engine may interface with the host/application through a serial peripheral interface (SPI) or an inter integrated circuit ($I^2C$).

Figure 20:
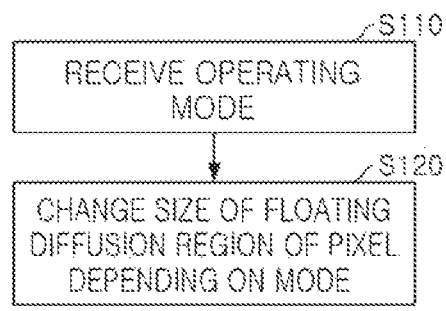
FIG. 20 is a diagram illustrating a method of operating the imaging device 10 according to an example embodiment.

FIG. 20 is a diagram illustrating a method of operating the imaging device 10 according to an example embodiment. Referring to FIGS. 1 to 20, the method of operating the imaging device 10 will be described below. The imaging device 10 may receive an operating mode (S110). The operating mode may be determined according to a user's selection or internal policy. The image sensor of the imaging device 10 may control at least one transistor to be turned on/off according to an operating mode selected thereafter, to change the size of the floating diffusion region of the pixel (S120). In this case, the size of the floating diffusion region may be adjusted by using junction capacitance or metal capacitance around the pixel. Accordingly, the conversion gain corresponding to the size of the floating diffusion region appropriately selected depending on the operating mode may be determined.

A pixel according to an example embodiment may implement three or more conversion gains (CG). In an example embodiment, the pixel may be implemented as a non-shared pixel or shared pixel structure. In an example embodiment, the conversion gain of the pixel may be varied using the capacitance of the surrounding pixel. In an example embodiment, the conversion gain of the pixel may be varied using the capacitance of the pixels in the row and column directions. In an example embodiment, the conversion gain of the pixel may be varied by a CG ratio from the unit pixel to the multi-switch (a multi-transistor).

The image sensor according to an example embodiment may be applied to a dynamic vision sensor (DVS).

As set forth above, in an image sensor, an imaging device including the same, and a method of operating the same according to an example embodiment, conversion gain may be controlled by adjusting the size of a floating diffusion region of a pixel depending on three or more operating modes.

While example embodiments have been illustrated and described above, it will be apparent to those skilled in the art that modifications and variations could be made without departing from the scope of the present inventive concept as defined by the appended claims.

What is claimed is:

1. An image sensor comprising:
   a first pixel comprising a first floating diffusion region and a second floating diffusion region;
   a second pixel comprising a first floating diffusion region, a second floating diffusion region, and a third floating diffusion region;
   a third pixel comprising a first floating diffusion region, a second floating diffusion region, and a third floating diffusion region; and
   a fourth pixel comprising a first floating diffusion region and a second floating diffusion region,
   wherein the second floating diffusion region of the first pixel and the second floating diffusion region of the second pixel are directly connected through a first metal line,
   wherein the third floating diffusion region of the second pixel and the third floating diffusion region of the third pixel are directly connected through a second metal line, and
   wherein each of the second pixel and the third pixel comprises a second conversion gain transistor provided directly between a second floating diffusion node corresponding to the second floating diffusion region of each of the second pixel and the third pixel and a third floating diffusion node corresponding to a third floating diffusion region of each of the second pixel and the third pixel based on a second conversion gain signal.

2. The image sensor of claim 1, wherein each of the first pixel, the second pixel, the third pixel, and the fourth pixel further comprises at least one photodiode.

3. The image sensor of claim 2, wherein each of the first pixel, the second pixel, the third pixel, and the fourth pixel comprises:
   a transfer transistor configured to connect the at least one photodiode and a first floating diffusion node corresponding to the first floating diffusion region of each of the first pixel, the second pixel, the third pixel, and the fourth pixel based on a transfer gate signal; and
   a first conversion gain transistor configured to connect the at least one photodiode and a second floating diffusion node corresponding to the second floating diffusion region of each of the first pixel and the fourth pixel and the second floating diffusion node corresponding to the second floating diffusion region of each of the second pixel and the third pixel based on a first conversion gain signal.

4. The image sensor of claim 3, wherein each of the first pixel and the fourth pixel comprises a reset transistor configured to provide a pixel driving voltage to the second floating diffusion node of each of the first pixel and the fourth pixel based on a reset gate signal.

5. The image sensor of claim 1, wherein the second floating diffusion region of the third pixel and the second floating diffusion region of the fourth pixel are connected through a metal line.

6. The image sensor of claim 1, wherein each of the first pixel, the second pixel, the third pixel, and the fourth pixel comprises:
   a source follower transistor comprising a gate connected to a first floating diffusion node corresponding to the first floating diffusion region of each of the first pixel, the second pixel, the third pixel, and the fourth pixel, and a source receiving a pixel driving voltage; and a selection transistor comprising a gate receiving a selection signal, a source connected to a drain of the source follower transistor, and a drain connected to an output line.

7. The image sensor of claim 1, wherein the first pixel and the second pixel are symmetrical with each other,
wherein the second pixel and the third pixel are symmetrical with each other, and
wherein the third pixel and the fourth pixel are symmetrical with each other.

8. An image sensor comprising:
a first pixel;
a second pixel;
a third pixel; and
a fourth pixel,
wherein each of the first to fourth pixels comprises:
  a first transistor configured to connect at least one photodiode and a first floating diffusion node based on a transfer gate signal;
  a second transistor configured to connect the first floating diffusion node and a second floating diffusion node based on a first conversion gain signal;
  a third transistor comprising a drain connected to the second floating diffusion node;
  a fourth transistor comprising a source connected to a power supply terminal configured to provide a pixel driving voltage and a gate connected to the first floating diffusion node; and
  a fifth transistor comprising a source connected to a drain of the fourth transistor, a drain connected to a column line, and a gate configured to receive a selection signal,
wherein the second floating diffusion node of the first pixel and the second floating diffusion node of the second pixel are directly connected through a metal line,
wherein a second floating diffusion node of the third pixel and the second floating diffusion node of the fourth pixel are directly connected through a metal line, and
wherein a third floating diffusion node of the second pixel and a third floating diffusion node of the third pixel are directly connected through a metal line.

9. The image sensor of claim 8, wherein the first pixel, the second pixel, the third pixel, and the fourth pixel are connected to one column line.

10. The image sensor of claim 8, wherein each of the first pixel, the second pixel, the third pixel, and the fourth pixel is connected to a corresponding column line.

11. The image sensor of claim 8, wherein the at least one photodiode is implemented in a two-photodiode (2-PD) structure and separated by a deep trench isolation (DTI).

12. The image sensor of claim 8, wherein the at least one photodiode is implemented in a two-photodiode (2-PD) structure separated by a PN junction.

13. The image sensor of claim 8, wherein the third transistor of each of the first pixel, the second pixel, the third pixel, and the fourth pixel connects the power supply terminal and the second floating diffusion node based on a reset gate signal.

14. The image sensor of claim 13, wherein the third transistor of each of the second pixel and the third pixel connects the second floating diffusion node and the third floating diffusion node based on a second conversion gain signal.

15. The image sensor of claim 14, wherein the first conversion gain signal and the second conversion gain signal are controlled to change a size of a floating diffusion region of a pixel based on an operating mode.

16. A method of operating an imaging device, the method comprising:
receiving an operating mode from an image sensor; and
controlling a size of a floating diffusion region of a pixel group based on the received operating mode,
wherein the operating mode comprises at least three operating modes,
wherein the pixel group comprises:
  a first pixel comprising a first floating diffusion region and a second floating diffusion region;
  a second pixel comprising a first floating diffusion region, a second floating diffusion region, and a third floating diffusion region;
  a third pixel comprising a first floating diffusion region, a second floating diffusion region, and a third floating diffusion region; and
  a fourth pixel comprising a first floating diffusion region and a second floating diffusion region,
wherein the second floating diffusion region of the first pixel and the second floating diffusion region of the second pixel are directly connected through a first metal line,
wherein the third floating diffusion region of the second pixel and the third floating diffusion region of the third pixel are directly connected through a second metal line, and
wherein each of the second pixel and the third pixel comprises a second conversion gain transistor provided directly between a second floating diffusion node corresponding to the second floating diffusion region of each of the second pixel and the third pixel and a third floating diffusion node corresponding to a third floating diffusion region of each of the second pixel and the third pixel based on a second conversion gain signal.

17. The method of claim 16,
wherein each of the first pixel, the second pixel, the third pixel, and the fourth pixel comprises:
  a first conversion gain transistor configured to connect the first floating diffusion region of each of the first pixel, the second pixel, the third pixel, and the fourth pixel and the second floating diffusion region of each of the first pixel, the second pixel, the third pixel, and the fourth pixel based on a first conversion gain signal; and
  a second conversion gain transistor configured to connect the second floating diffusion region of each of the second pixel and the third pixel and the third floating diffusion region of each of the second pixel and the third pixel based on a second conversion gain signal.

18. The method of claim 17, wherein the controlling the size of the floating diffusion region comprises controlling timing of providing the first conversion gain signal and the second conversion gain signal based on the operating mode to change the size of the floating diffusion region.

* * * * *